(12) United States Patent
Yoo et al.

(10) Patent No.: US 11,755,155 B2
(45) Date of Patent: Sep. 12, 2023

(54) DISPLAY DEVICE AND TOUCH INPUT SYSTEM

(71) Applicant: SAMSUNG DISPLAY CO., LTD., Yongin-si (KR)

(72) Inventors: Gi Na Yoo, Cheonan-si (KR); Ju Yeon Kim, Asan-si (KR); Won Sang Park, Yongin-si (KR); Chang Woo Shim, Cheonan-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/821,202

(22) Filed: Aug. 22, 2022

(65) Prior Publication Data

US 2023/0229269 A1    Jul. 20, 2023

(30) Foreign Application Priority Data

Jan. 17, 2022    (KR) .......................... 10-2022-0006582

(51) Int. Cl.
| | |
|---|---|
| *G06F 3/044* | (2006.01) |
| *H10K 50/86* | (2023.01) |
| *H10K 59/38* | (2023.01) |
| *H10K 59/40* | (2023.01) |

(52) U.S. Cl.
CPC .......... *G06F 3/0441* (2019.05); *G06F 3/0446* (2019.05); *H10K 50/865* (2023.02); *H10K 59/38* (2023.02); *H10K 59/40* (2023.02); *G06F 2203/04112* (2013.01)

(58) Field of Classification Search
CPC ...... H10K 59/40; H10K 59/865; H10K 59/38; G06F 2203/04112; G06F 3/0412; G06F 3/0442; G06F 3/0446; G06F 3/0448; G06F 3/0441

See application file for complete search history.

(56) References Cited

U.S. PATENT DOCUMENTS

| | | |
|---|---|---|
| 9,927,562 B2 | 3/2018 | Lemay et al. |
| 2015/0123935 A1* | 5/2015 | Park ...................... G06F 3/0448 |
| | | 345/174 |

FOREIGN PATENT DOCUMENTS

KR    10-2023-0016737    2/2023

* cited by examiner

*Primary Examiner* — Lisa S Landis
(74) *Attorney, Agent, or Firm* — F. CHAU & ASSOCIATES, LLC

(57) ABSTRACT

A display device and a touch input system are provided, the display device comprising a display unit including a plurality of light emission areas; a plurality of touch electrodes disposed between the plurality of light emission areas to sense a touch input; at least one light shielding pattern formed by covering at least a portion of a front surface of at least one of the plurality of touch electrodes; and one of a first set of color filters comprising first to third colors or a second set of color filters comprising first to fourth colors, which are alternately disposed in the plurality of light emission areas, wherein the color filters of one of the first or second set of color filters are used as code patterns by including an infrared absorbing pigment.

20 Claims, 19 Drawing Sheets

DISPLAY DEVICE AND TOUCH INPUT SYSTEM

CROSS-REFERENCE TO RELATED APPLICATION

This U.S. non-provisional patent application claims priority under 35 U.S.C. § 119 to Korean Patent Application No. 10-2022-0006582, filed on Jan. 17, 2022 in the Korean Intellectual Property Office, the disclosure of which is hereby incorporated by reference in its entirety.

TECHNICAL FIELD

Embodiments of the present disclosure relate generally to display devices and in particular to a display device including a touch input system.

DISCUSSION OF RELATED ART

With the advancement of the information age, the demand for a display device for displaying an image has taken on various forms. For example, the display device has been incorporated into various electronic devices such as, for example, a smart phone, a digital camera, a laptop computer, a navigator and a smart television. The display device may be a flat panel display device such as a liquid crystal display device, a field emission display device or an organic light emitting display device. The light emitting display device is a type of flat panel display device that includes a light emitting element in which a plurality of pixels that comprise a display panel may individually emit light to display an image without the aid of a backlight unit.

Display devices that support a touch input may use a portion of a user's body (e.g., a finger) or an electronic pen. The display device may sense the touch input more precisely using an electronic pen compared with using a portion of the user's body.

SUMMARY

An object of the present disclosure is to provide a display device and a touch input system including the display device, in which a touch input of a touch input device may be performed using code patterns of a display panel.

Another object of the present disclosure is to provide a display device and a touch input system including the display device, in which a color filter, formed in any light emission area comprising red, green and blue pixels, may be formed and used as a code pattern.

The objects of the present disclosure are not limited to those mentioned above and additional objects of the present disclosure, which are not mentioned herein, will be clearly understood by those skilled in the art from the following description of the present disclosure.

According to an embodiment of the present disclosure, a display device comprises a display unit including a plurality of light emission areas; a plurality of touch electrodes disposed between the plurality of light emission areas configured to sense a touch input; at least one light shielding pattern formed by covering a portion or all of a front surface of at least one of the plurality of touch electrodes; and color filters selected from among first to third colors or color filters selected from among first to fourth colors are alternately disposed in the plurality of light emission areas, wherein the color filters from among any one of the first to third colors or the first to fourth colors are used as code patterns by including an infrared absorbing pigment.

In an embodiment, the plurality of touch electrodes include a plurality of driving electrodes, a plurality of sensing electrodes, and a plurality of dummy electrodes, wherein the plurality of driving electrodes, the plurality of sensing electrodes and the plurality of dummy electrodes are formed in a mesh structure surrounding portions between the plurality of light emission areas and the periphery of the plurality of light emission areas.

In an embodiment, the at least one light shielding pattern has at least one planar closed loop shape which may be one of a rectangle, a square, a circle or a rhombus, an open loop shape partially surrounding at least one of the plurality of light emission areas, or a straight line shape of a predetermined length.

In an embodiment, the at least one light shielding pattern includes an organic pigment that shields light of a visible light band and transmits infrared rays and is patterned to cover a portion of a front surface and a side of the at least one touch electrode.

In an embodiment, the at least one light shielding pattern includes at least one organic pigment of lactam black, perylene black, or aniline black.

In an embodiment, the at least one light shielding pattern is formed in a mesh shape surrounding portions between the plurality of light emission areas and the periphery of the light emission areas and is patterned to cover a portion of a front surface and a side of the at least one touch electrode.

In an embodiment, the third color filters, which are disposed at a predetermined interval, among the color filters of first to third colors or first to fourth colors are used as the code patterns. In an embodiment, the third color filter selected for use as the code patterns is a blue color filter.

In an embodiment, the third color filters which are used as the code patterns, are formed to have a shape and planar area different from those of the color filters that are not used as the code patterns.

In an embodiment, an infrared absorbing pigment is included in the third color filters selected for use as code patterns at a predetermined ratio in accordance with an infrared light emitting wavelength band of a touch input device to absorb infrared light emitted from the touch input device.

In an embodiment, the third color filters selected for use as the code patterns, overlap a portion of the touch electrode or the dummy electrode, and are disposed adjacent to the touch electrode and dummy electrode to form a position code.

In an embodiment, the third color filters selected for use as the code patterns, overlap a portion of a front surface of the touch electrode or the dummy electrode, and are disposed adjacent to at least one of four diagonal directions, i.e., first to fourth directions.

In an embodiment, the color filters selected for use as the code patterns, are formed to overlap a front surface of the touch electrode or the dummy electrode, which is disposed to be adjacent to a first and second directions, or are otherwise formed to overlap a front surface of the touch electrode or the dummy electrode, which is disposed to be adjacent to the third and fourth directions.

In an embodiment, the third color filters selected for use as the code patterns, are formed to overlap a portion of a front surface of the touch electrode or the dummy electrode, which is disposed to be adjacent to at least one of the left, right, upper and lower directions.

In an embodiment, the third color filters selected for use as the code patterns, are formed to have a planar area wider than that of the other color filters that are not selected for use as the code patterns.

In an embodiment, the color filters of the third color, which are used as the code patterns, are formed to include at least one of a cyanin-based compound, a polymethine-based compound, an anthraquinone-based compound, or a phthalocyanine-based compound differently from the other color filters that are not used as the code patterns.

In an embodiment, the third color filters of the first set of color filters selected for use as the code patterns, are formed in a predetermined positional code shape that is partially overlapped with the touch electrode or the dummy electrode, which is disposed to be adjacent to the touch or dummy electrode, and to the other adjacent color filters not selected for use as the code patterns.

In an embodiment, the third color filters selected for use as the code patterns, are formed to have a greater height or greater thickness than the other color filters not selected for use as the code patterns. Further, the third color filters selected for use as the code patterns are disposed to be adjacent to the other color filters not selected for use as the code patterns such that a portion of the third color filters overlaps another color filter disposed to be adjacent thereto.

In an embodiment, the third color filters selected for use as the code patterns, are formed to have a greater height or greater thickness than the height or thickness of the other color filters disposed to be adjacent to the third color filters, and the third color filters selected for use as the code patterns are formed in a predetermined positional code shape by being overlapped with a portion of a front surface of the touch electrode or the dummy electrode, which is disposed to be adjacent to the third color filters.

According to an embodiment of the present disclosure, a touch input system comprises a display device configured to display an image; a touch input device configured to receive a touch input to the display device, wherein the display device includes a display unit including a plurality of light emission areas; a plurality of touch electrodes disposed between the plurality of light emission areas to sense a touch input; at least one light shielding pattern formed by covering a portion or all of a front surface of at least one of the plurality of touch electrodes; and first color filters from among first to third color filters or second color filters from among first to fourth color filters, which are alternately disposed in the plurality of light emission areas, wherein the color filters of any one of the first to third color filters of a first set comprising first to third color filters or the second set comprising first to fourth color filters, which are disposed at a predetermined interval, are used as code patterns by including an infrared absorbing pigment.

In an embodiment, the touch input device includes a code detector detecting the code patterns; a code processor receiving shape data for the code patterns, extracting a data code corresponding to a shape of the code patterns, and generating coordinate data corresponding to the data code; and a communication module transmitting the coordinate data to the display device.

In the display device and the touch input system including the display device, according to embodiments of the present disclosure, touch coordinate data of a touch input device may be generated without complicated computation or need for correction by using the code patterns of a display panel to enable a touch input of the touch input device to be performed. In particular, a touch input function using accurate input coordinates may be performed, which both reduces cost and power consumption and further simplifies a driving process.

According to embodiments of the present disclosure, a color filter formed in at least one of light emission areas, comprised of red, green and blue pixels is formed and used as a code pattern, thereby simplifying a manufacturing process and reducing manufacturing costs.

The effects according to the embodiments of the present disclosure are not limited to those mentioned above and more various effects are included in the following description of the present disclosure.

BRIEF DESCRIPTION OF THE DRAWINGS

The above and other aspects and features of the present disclosure will be more clearly understood from the following detailed description taken in conjunction with the accompanying drawings, in which.

DETAILED DESCRIPTION OF THE DISCLOSURE

The present invention will now be described more fully hereinafter with reference to the accompanying drawings, in which preferred embodiments of the present disclosure are shown. This present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, detailed embodiments of the present disclosure will be described with reference to the accompanying drawings.

Figure 1:
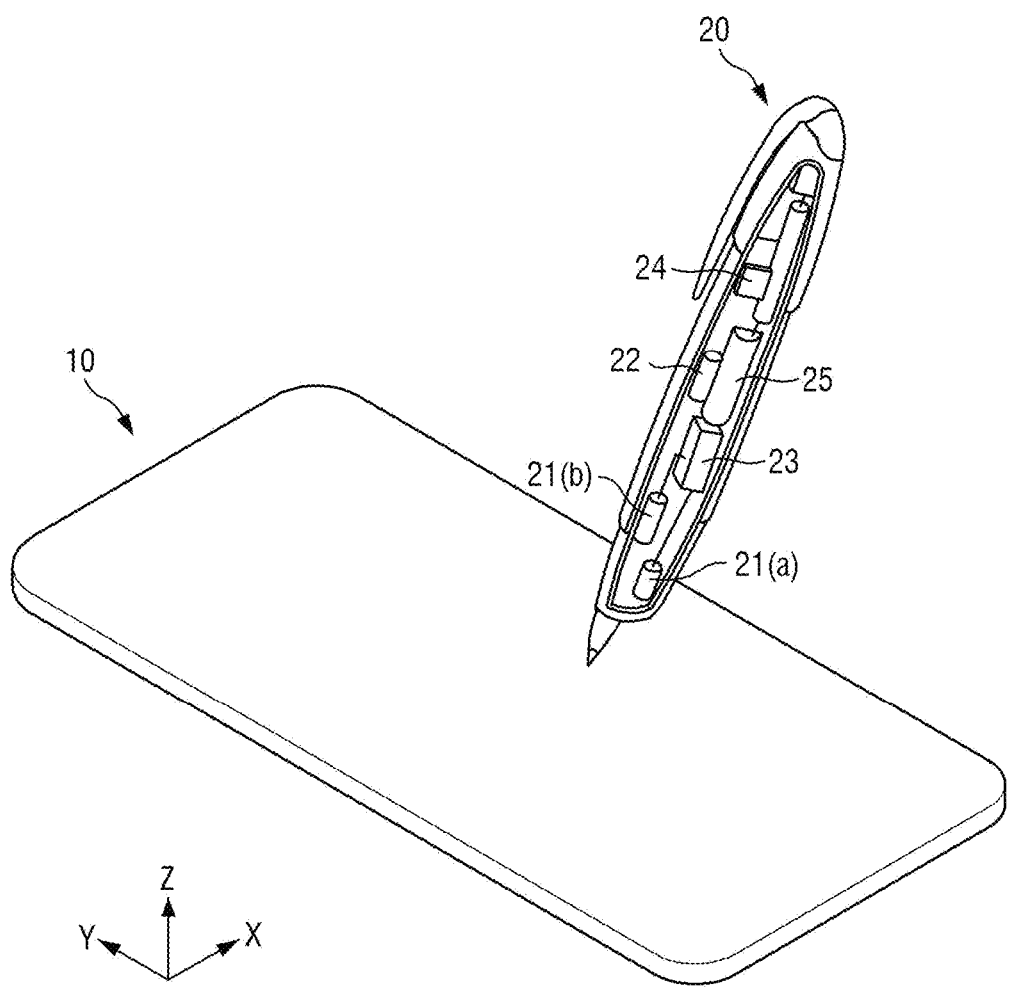
FIG. 1 is a schematic view illustrating a touch input system according to an embodiment.
Figure 2:
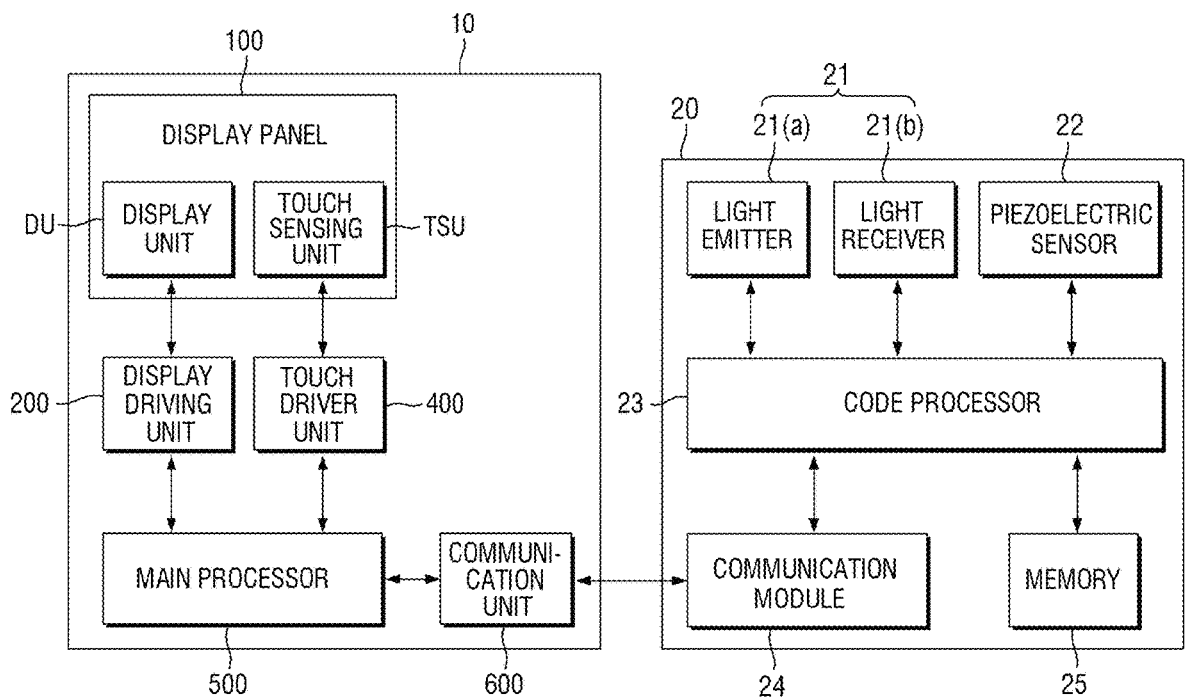
FIG. 2 is a detailed schematic block view illustrating a touch input device and a display device, shown in FIG. 1, according to an embodiment.

FIG. 1 is a schematic view illustrating a touch input system according to one embodiment of the present disclosure, and FIG. 2 is a detailed schematic block view illustrating a touch input device and a display device, shown in FIG. 1.

Referring to FIG. 1, the display device 10 may be incorporated within a portable electronic device such as a mobile phone, a smart phone, a tablet personal computer (PC), a mobile communication terminal, an electronic diary, an electronic book, a portable multimedia player (PMP), a navigator, and an ultra mobile PC (UMPC). Further examples include a television, a laptop computer, a monitor, a signboard, or a display unit of Internet of things (IoT), a wearable device such as a smart watch, a watch phone, an eyeglasses-type display and a head mounted display (HMD).

Referring to FIG. 2, the display device 10 includes a display panel 100, a display driving unit 200, a touch driver unit 400, a main processor 500, and a communication unit 600. The touch input device 20 includes a code detector 21 including a light emitter 21(a) and a light receiver 21(b), a piezoelectric sensor 22, a code processor 23, a communication module 24, and a memory 25.

The display device 10 uses the touch input device 20 as a touch input instrument. The display panel 100 of the display device 10 may include a display unit DU for displaying an image, and a touch sensing unit TSU for sensing the touch of a human body portion such as a finger or sensing touch input device 20 input.

The display unit DU of the display panel 100 may include a plurality of unit pixels and may display an image through the plurality of unit pixels. Each unit pixel in the display panel 100 is defined as having a minimum unit size for outputting light and each individual pixel may include first to third subpixels or first to fourth subpixels. The respective pixels may be sequentially disposed on the display unit DU in one of a vertical or horizontal stripe structure to display an image. Alternatively, Alternatively, the respective unit pixels including the first to fourth subpixels may be disposed on the display unit DU in a Pentile™ matrix structure to display an image. Each subpixel includes one light emission area. For example, the first to third subpixels include first to third light emission areas. The first to fourth subpixels include first to fourth light emission areas. Color filters comprising red, green and blue colors may be formed in the respective first to third light emission areas, respectively, whereby the first to third subpixels may emit red light, green light, and blue light, respectively. In addition, color filters of red, green, blue and green colors are respectively formed in the first to fourth light emission areas, whereby the first subpixel may emit a red light, a second subpixel may emit a green light, a third subpixel may emit a blue light and a fourth subpixel may emit a green light.

The red, green, and blue color filters of the first to third subpixels, or the red, green, blue and green color filters of the first to fourth subpixels may be alternately and sequentially disposed. In this way, the color filters of at least one color, which are disposed at a predetermined interval, from among the red, green and blue color filters, which are alternately and sequentially disposed, may be formed and used as code patterns. For example, the blue color filters disposed at a predetermined interval of about 300 μm among the red, green, and blue color filters alternately and sequentially disposed with each other may be formed and used as code patterns. The respective color filters selected for use as code patterns are formed to include an infrared absorbing pigment that is different from the pigment used for the other color filters not selected for use as the code patterns. In this case, the infrared absorbing pigment may be included in the selected color filters at a predetermined ratio.

In addition, each color filter used as the code pattern may be formed to have a shape and a planar area, different from the shape and planar area of the other color filters not used as the code patterns. To this end, each color filter used as the code pattern may be formed in a predetermined positional code shape. Accordingly, each color filter used as the code pattern is sensed as a code pattern in the touch input device 20 in accordance with a shape, area, and size that absorb infrared rays. The other color filters that are not used as the code patterns may be formed of a material that transmits infrared rays without including an infrared absorbing pigment, and thus may not be sensed as code patterns in the touch input device 20. The formation and structural arrangement of each of the color filters used as the code patterns and the associated formation method will be described in greater detail below with reference to the accompanying drawings.

The touch sensing unit TSU of the display panel 100 may be formed on a front surface of the display panel 100. The touch sensing unit TSU may include a plurality of touch electrodes to sense a variation in capacitance from a touch input of a user. In this case, a light shielding pattern for shielding light of a visible light wavelength band is formed on a front surface of the plurality of the touch electrodes or a front surface of at least a predetermined portion of the plurality of touch electrodes. The light shielding pattern may be formed of a light shielding member in which an organic pigment capable of shielding light of a visible light wavelength band and transmitting light of an infrared wavelength band at a predetermined ratio. Therefore, the light shielding pattern may shield red visible light, green and blue visible light, which are emitted from the light emission areas adjacent to one another, so as not to be mixed with one another, and may partially transmit or reflect infrared light applied from the front surface.

The light shielding patterns may reduce reflective characteristics and reflectance of the touch electrodes by covering the front surface of the touch electrodes so that the front surface of the touch electrodes is not exposed. Therefore, it is possible to increase a recognition rate and accuracy of the code patterns of the touch input device 20 by reducing the influence of reflective light due to the touch electrodes.

The display driver unit 200 may output signals and voltages for driving the display unit DU. The display driver 200 may supply data voltages to data lines. The display driver 200 may supply a power voltage to a power line and supply gate control signals to a gate driver.

The touch driver unit 400 may be connected to the touch sensing unit TSU. The touch driver unit 400 may supply a touch driving signal to a plurality of touch electrodes of the touch sensing unit TSU and sense a variation in capacitance between the plurality of touch electrodes. The touch driver unit 400 may calculate a touch input and touch coordinates of a user based on the sensed change in capacitance between the plurality of touch electrodes.

The main processor 500 may control all functions of the display device 10. For example, the main processor 500 may supply digital video data to the display driving unit 200 so that the display panel 100 displays an image. For example, in the case where the user provides a touch input (e.g., a finger), the main processor 500 may receive touch data from the touch driver 400 to determine the touch coordinates of the user and may generate the digital video data based on the determined touch coordinates of the user or may also execute applications indicated by icons displayed in accordance with the touch coordinates of the user. The main processor 500 may also determine the touch coordinates of the touch input device 20 by receiving the coordinate data directly from the touch input device 20 and then may generate the digital video data based on the determined touch coordinates or otherwise execute applications indicated by icons displayed on the display unit DU.

The communication unit 600 may perform wired/wireless communication with an external device. For example, the communication unit 600 may transmit and receive a communication signal with the communication module 24 of the touch input device 20. The communication unit 600 may receive coordinate data comprised of data codes from the touch input device 20 and may provide the coordinate data to the main processor 500.

The touch input device 20 may be used as a touch input instrument and may be comprised of an electronic pen such as a smart pen. In one embodiment, the touch input device 20 may be an electronic pen for sensing display light emitted from the display panel 100 or light reflected from the display panel 100 by using an optical method, and based on the sensed light, the touch input device 20 may detect positional code shapes of those color filters used as code patterns included in the display panel 100 and generate coordinate data in accordance with the detected result. The touch input device 20 may be an electronic pen of a writing instrument shape, but is not limited to a writing instrument type or structure.

The code detector 21 of the touch input device 20 is disposed to be adjacent to a pen tip portion of the touch input device 20 to detect code patterns included in the display panel 100, that is, the detection of color filters used as code patterns in the display panel 100. To this end, the code detector 21 includes at least one light emitting unit 21(a) for emitting infrared light by using at least one infrared light source and at least one light receiving unit 21(b) for detecting infrared light reflected from the code patterns through an infrared camera.

The at least one infrared light source included in the light emitting unit 21(a) of the code detector 21 may be comprised of an infrared LED array disposed in a matrix structure. The infrared camera of the light receiving unit 21(b) may include a filter for blocking all wavelength bands other than infrared rays thus allowing only infrared rays to pass therethrough. The light emitting unit 21(a) may be further comprised of a lens system for focusing the infrared rays passing through the filter, and an optical image sensor for converting an optical image formed by the lens system into an electrical image signal and outputting the image signal. The optical image sensor may be comprised of an array disposed in a matrix structure in the same configuration as the infrared LED array to provide shape data of the code patterns to the code processor 23 in accordance with the form of infrared rays reflected from the code patterns. In this manner, the code detector 21 of the touch input device 20 may continuously detect code patterns included in some areas of the touch sensing unit TSU in accordance with the control and movement of the user and may continuously generate the shape data of the detected code patterns and provide the shape data to the code processor 23.

The code processor 23 may continuously receive the shape data of the code patterns from the code detector 21. For example, the code processor 23 may continuously receive the shape data for the code patterns and may identify both the structural arrangement and shape of the code patterns. The code processor 23 may extract or generate data codes corresponding to the arrangement structure and shape of the code patterns and may combine the data codes to extract or generate coordinate data corresponding to the combined data codes. The code processor 23 may transmit the generated coordinate data to the display device 10 through the communication module 24. In particular, the code processor 23 may quickly generate coordinate data without complex computation and correction by receiving the shape data of the code detector to generate and convert the data codes corresponding to the code patterns.

The communication module 24 may perform wired/wireless communication with an external device. For example, the communication module 24 may transmit and receive a communication signal to and from the communication unit 600 of the display device 10. The communication module 24 may receive coordinate data comprised of data codes from the code processor 23 and provide the coordinate data to the communication unit 600.

The memory 25 may store data necessary for driving the touch input device 20. The shape data of the code patterns and data codes corresponding to the shape data and the code patterns are stored in the memory 25. In addition, the data codes and coordinate data according to combinations of the data codes are stored in the memory 25. The memory 25 shares the data codes corresponding to the shape data and the code patterns, and coordinate data according to combinations of the data codes with the code processor 23. Therefore, the code processor 23 may combine the data codes stored in the memory 25 through the coordinate data and may extract or generate coordinate data corresponding to the combined data codes.

Figure 3:
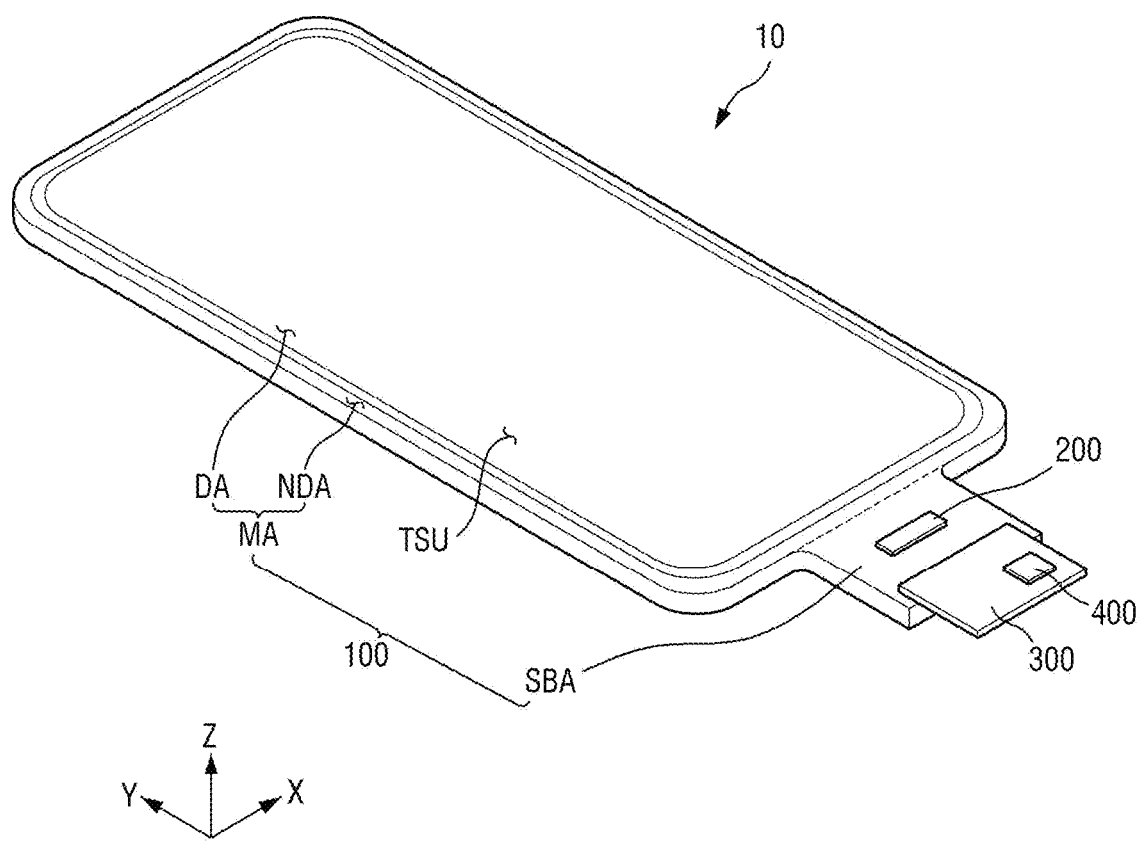
FIG. 3 is a detailed perspective view illustrating a configuration of a display device shown in FIG. 2 according to an embodiment.
Figure 4:
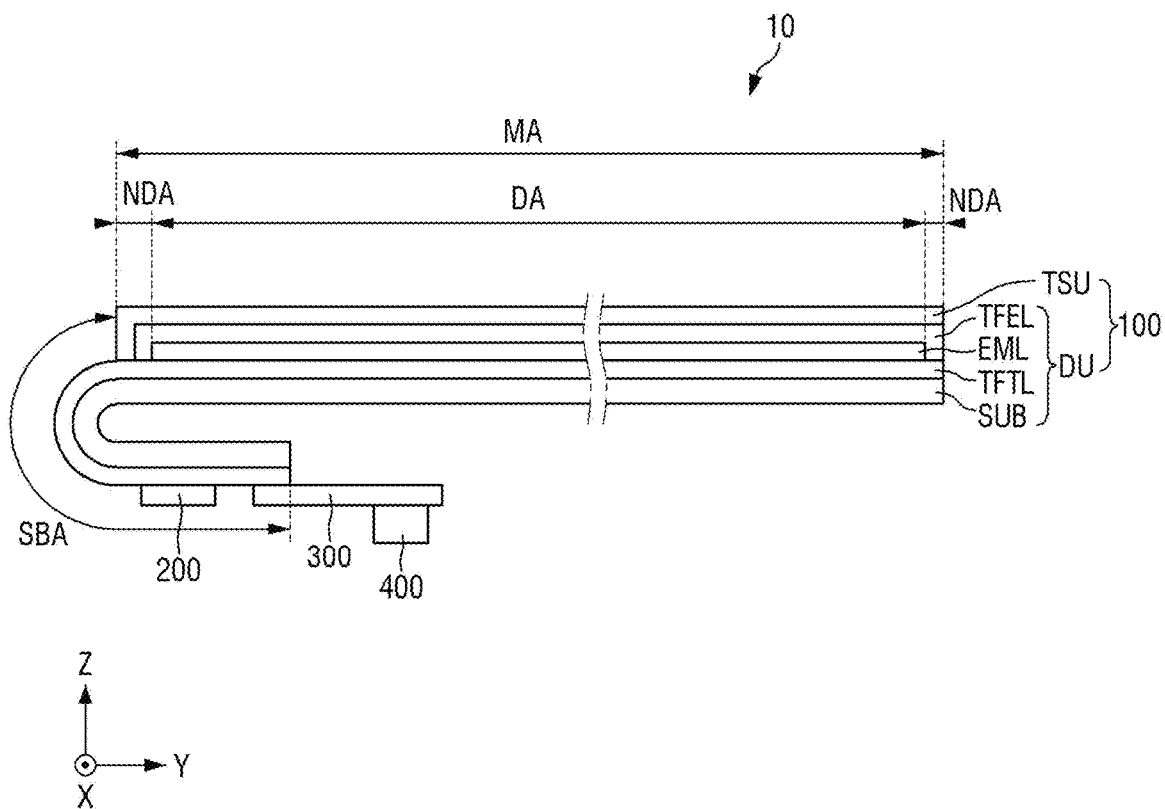
FIG. 4 is a detailed cross-sectional view illustrating a configuration of a display device shown in FIG. 2 according to an embodiment.

FIG. 3 is a detailed perspective view illustrating a configuration of a display device shown in FIG. 2. FIG. 4 is a detailed cross-sectional view illustrating a configuration of a display device shown in FIG. 2.

Referring to FIGS. 3 and 4, the display device 10 may be formed in a planar shape (e.g., a rectangular shape). For example, the display device 10 may have a planar shape similar to a rectangular shape having short sides in X-axis direction and long sides in Y-axis direction. A corner where the short side of the X-axis direction and the long side of the Y-axis direction meet may be a rounded corner having a predetermined curvature or otherwise formed at a right angle. The planar shape of the display device 10 is not limited to a rectangular shape and may be formed to have other shapes, including, for example, a polygonal shape, a circular shape or an oval shape.

The display panel 100 may include a main area MA and a sub-area SBA.

The main area MA may include a display area DA including a plurality of pixels displaying an image and a non-display area NDA disposed near the display area DA. The display area DA may emit light from a plurality of light emission areas or a plurality of opening areas. For example, the display panel 100 may include a pixel circuit including switching elements, a pixel defining layer defining a light emission area or an opening area, and a self-light emitting element.

The non-display area NDA may be an area outside of the display area DA. The non-display area NDA may be defined as an edge area of the main area MA of the display panel 100. The non-display area NDA may include a gate driver (not shown) supplying gate signals to gate lines, and fan-out lines (not shown) connecting the display driver unit 200 with the display area DA.

The sub-area SBA may extend from one side of the main area MA. The sub-area SBA may include a flexible material capable of being subjected to bending, folding, rolling and the like. For example, when the sub-area SBA is bent, the sub-area SBA may overlap the main area MA in a thickness direction (Z-axis direction). The sub-area SBA may include a display driver unit 200 and a pad area connected to the circuit board 300. In one embodiment, the sub-area SBA may be omitted, and the display driver 200 and the pad area may be disposed in the non-display area NDA.

The display driver unit 200 may be formed of an integrated circuit (IC) and may be packaged on the display panel 100 by a chip on glass (COG) method, a chip on plastic (COP) method or an ultrasonic bonding method. For example, the display driver unit 200 may be disposed in the sub-area SBA and may overlap the main area MA in the thickness direction (Z-axis direction) by bending of the sub-area SBA. In an embodiment, the display driver 200 may be packaged on the circuit board 300.

The circuit board 300 may be attached onto the pad area of the display panel 100 by using an anisotropic conductive film (ACF). Lead lines of the circuit board 300 may be electrically connected to the pad area of the display panel 100. The circuit board 300 may be a flexible printed circuit board, a printed circuit board or a flexible film such as a chip on film.

The touch driver unit 400 may be packaged on the circuit board 300. The touch driver 400 may be formed as an integrated circuit (IC). As described above, the touch driver unit 400 may supply a touch driving signal to a plurality of touch electrodes of the touch sensing unit TSU and may sense a change in capacitance between the plurality of touch electrodes. The touch driving signal may be a pulse signal having a predetermined frequency. The touch driver unit 400 calculates a touch input of a body portion of a user, such as a finger, and touch coordinates based on the sensed change in capacitance between the plurality of touch electrodes.

Referring to FIG. 4, the display panel 100 may include a display unit DU and a touch sensing unit TSU. The display unit DU may include a substrate SUB, a thin film transistor layer TFTL, a light emitting element layer EML, and an encapsulation layer TFEL.

The substrate SUB may be a base substrate or a base member. The substrate SUB may be a flexible substrate SUB capable of being subjected to bending, folding, rolling and the like. For example, the substrate SUB may include a glass material or a metal material, but is not limited thereto. As another example, the substrate SUB may include a polymer resin such as polyimide (PI).

The thin film transistor layer TFTL may be disposed on the substrate SUB. The thin film transistor layer TFTL may include a plurality of thin film transistors constituting a circuit of pixels. The thin film transistor layer TFTL may further include gate lines, data lines, power lines, gate control lines, fan-out lines connecting the display driver unit 200 with the data lines, and lead lines connecting the display driver unit 200 with the pad area. When the gate driver is formed on one side of the non-display area NDA of the display panel 100, the gate driver may include thin film transistors.

The thin film transistor layer TFTL may be disposed in the display area DA, the non-display area NDA and the sub-area SBA. The thin film transistors of each pixel in the thin film transistor layer TFTL, the gate lines, the data lines and the power lines may be disposed in the display area DA. The gate control lines and fan out lines of the thin film transistor layer TFTL may be disposed in the non-display area NDA. The lead lines of the thin film transistor layer TFTL may be disposed in the sub-area SBA.

The light emitting element layer EML of the display unit DU may be disposed on the thin film transistor layer TFTL. The light emitting element layer EML may include a plurality of light emitting elements that include a first electrode, a light emitting layer and a second electrode, which are sequentially stacked to emit light, and a pixel defining layer that defines pixels. The plurality of light emitting elements of the light emitting element layer EML may be disposed in the display area DA. The light emitting layer may be an organic light emitting layer that includes an organic material. The light emitting layer may include a hole transporting layer, an organic light emitting layer, and an electron transporting layer. When the first electrode receives a predetermined voltage through the thin film transistor of the thin film transistor layer TFTL and the second electrode receives a cathode voltage, holes and electrons may move to the organic light emitting layer through the hole transporting layer and the electron transporting layer, respectively, and may be combined with each other in the organic light emitting layer to emit light. For example, the first electrode may be an anode electrode and the second electrode may be a cathode electrode, but they are not limited thereto.

In an embodiment, the plurality of light emitting elements may include a quantum dot light emitting diode including a quantum dot light emitting layer, or an inorganic light emitting diode including an inorganic semiconductor.

The encapsulation layer TFEL of the display unit DU may cover an upper surface and a side of the light emitting element layer EML and protect the light emitting element layer EML. The encapsulation layer TFEL may include at least one inorganic layer and at least one organic layer to encapsulate the light emitting element layer EML.

The touch sensing unit TSU may be disposed on the encapsulation layer TFEL. The touch sensing unit TSU may include a plurality of touch electrodes for sensing a capacitance variation from user's touch and touch lines for connecting the plurality of touch electrodes with the touch driver unit 400. For example, the touch sensing unit TSU may sense a user's touch in a mutual capacitance manner or a self-capacitance manner.

In an embodiment, the touch sensing unit TSU may be disposed on a separate substrate disposed on the display unit DU. In this case, the substrate for supporting the touch sensing unit TSU may be a base member for encapsulating the display unit DU.

A plurality of touch electrodes of the touch sensing unit TSU may be disposed in a touch sensor area overlapped with the display area DA. The touch lines of the touch sensing unit TSU may be disposed in a touch peripheral area overlapped with the non-display area NDA.

The sub-area SBA of the display panel 100 may extend from one side of the main area MA. The sub-area SBA may include a flexible material capable of being subjected to bending, folding, rolling and the like. For example, when the sub-area SBA is bent, the sub-area SBA may overlap the main area MA in the thickness direction (Z-axis direction). The sub-area SBA may include a display driver unit 200, and a pad area connected to the circuit board 300.

Figure 5:
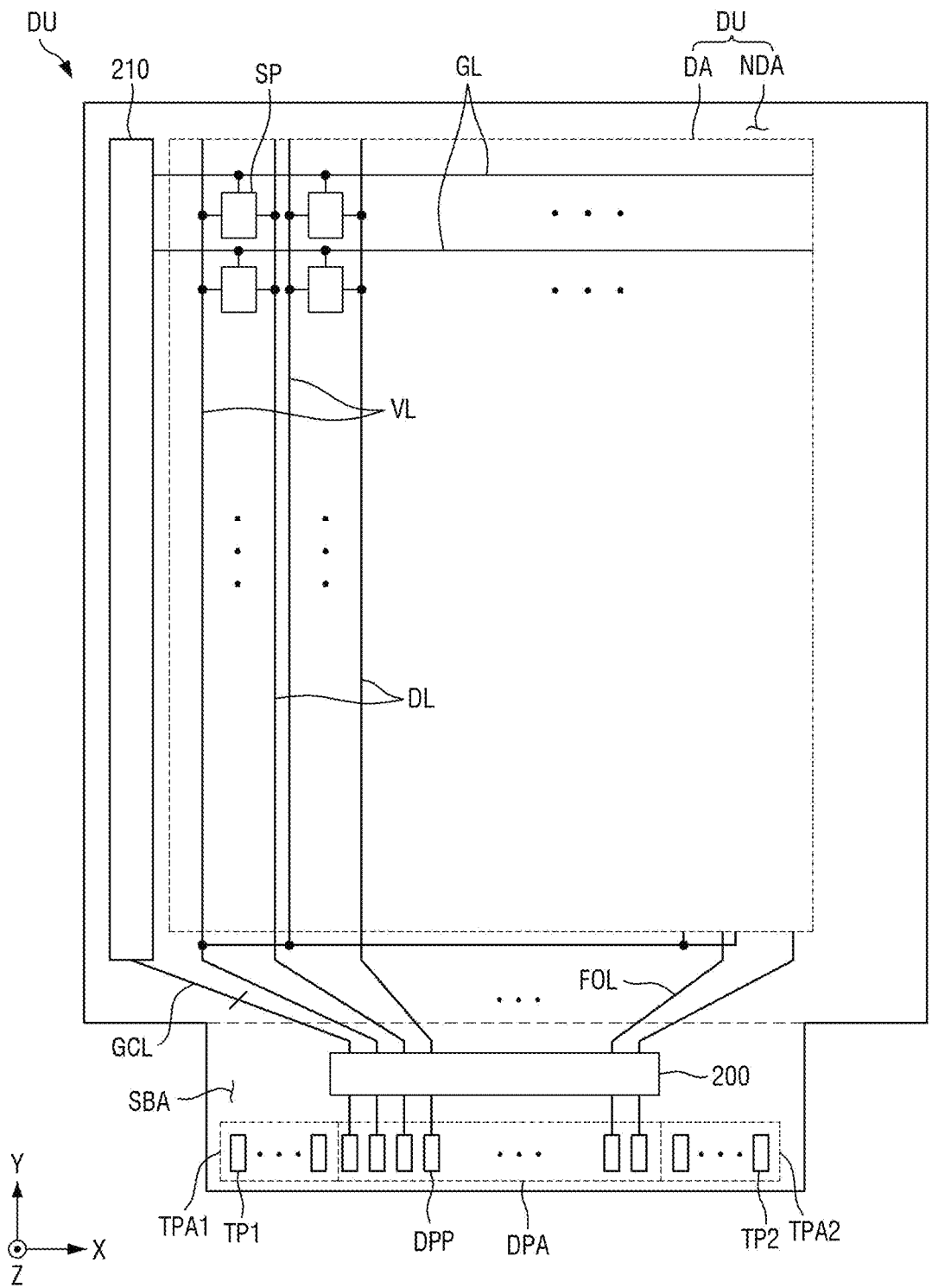
FIG. 5 is a plan view illustrating a display unit of a display device according to an embodiment.

FIG. 5 is a plan view illustrating a display unit of a display device according to one embodiment of the present disclosure.

Referring to FIG. 5, the display area DA of the display unit DU is an area for displaying an image and may be defined as a central area of the display panel 100. The display area DA may include a plurality of pixels SP, a plurality of gate lines GL, a plurality of data lines DL and a plurality of power lines VL. Each of the plurality of pixels SP may be defined as a minimum unit for outputting light.

The plurality of gate lines GL may supply gate signals received from the gate driver unit 210 to the plurality of pixels SP. The plurality of gate lines GL may extend in the X-axis direction and may be spaced apart from each other in the Y-axis direction crossing the X-axis direction.

The plurality of data lines DL may supply data voltages received from the display driver unit 200 to the plurality of pixels SP. The plurality of data lines DL may extend in the Y-axis direction and may be spaced apart from each other in the X-axis direction.

The plurality of power lines VL may supply the power voltage received from the display driver unit 200 to the plurality of pixels SP. The power voltage may be at least one of a driving voltage, an initialization voltage or a reference voltage. The plurality of power lines VL may extend in the Y-axis direction and may be spaced apart from each other in the X-axis direction.

The non-display area NDA of the display unit DU may surround the display area DA. The non-display area NDA may include a gate driver unit 210, fan-out lines FOL and gate control lines GCL. The gate driver unit 210 may generate a plurality of gate signals based on gate control signals and may sequentially supply the plurality of gate signals to the plurality of gate lines GL in accordance with a predetermined order.

The fan-out lines FOL may extend from the display driver unit 200 to the display area DA. The fan-out lines FOL may supply the data voltages received from the display driver unit 200 to the plurality of data lines DL.

The gate control line GCL may extend from the display driver unit 200 to the gate driver unit 210. The gate control line GCL may supply the gate control signals received from the display driver unit 200 to the gate driver unit 210.

The sub-area SBA may include a display driver unit 200, a display pad area DPA, and first and second touch pad areas TPA1 and TPA2.

The display driver unit 200 may output signals and voltages for driving the display panel 100 to the fan-out lines FOL. The display driver unit 200 may supply the data voltages to the data lines DL through the fan-out lines FOL. The data voltages may be supplied to the plurality of pixels SP, and may determine luminance of the plurality of pixels SP. The display driver unit 200 may supply the gate control signals to the gate driver 210 through the gate control line GCL.

The display pad area DPA, the first touch pad area TPA1 and the second touch pad area TPA2 may be disposed at the edge of the sub-area SBA. The display pad area DPA, the first touch pad area TPA1 and the second touch pad area TPA2 may be electrically connected to the circuit board 300 by using a low resistance high reliability material such as an anisotropic conductive film or a self-assembly anisotropic conductive paste (SAP).

The display pad area DPA may include a plurality of display pad portions DPP. The plurality of display pad portions DPP may be connected to the main processor 500 through the circuit board 300. The plurality of display pad portions DPP may be connected to the circuit board 300 to receive digital video data and may supply the digital video data to the display driver 200.

Figure 6:
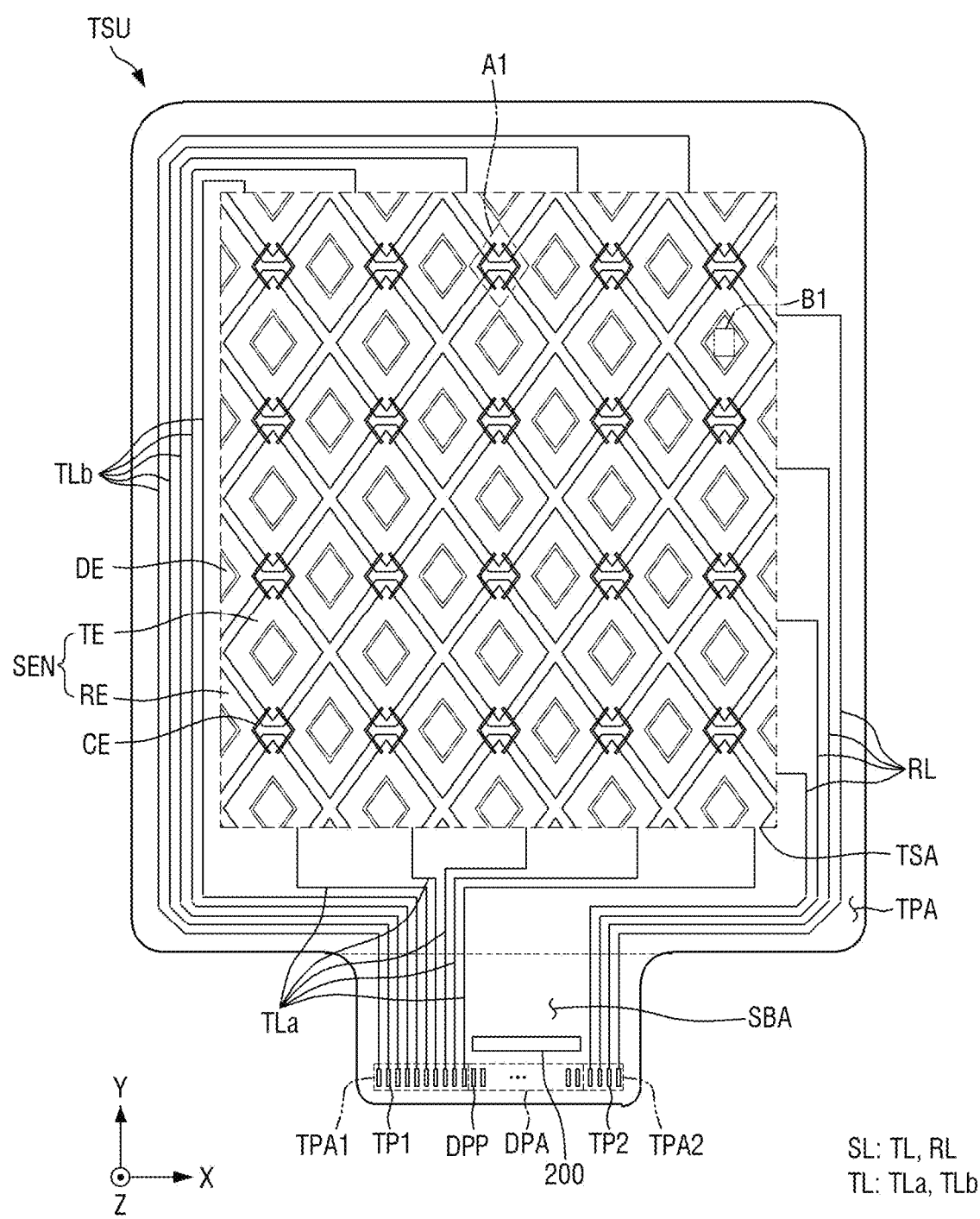
FIG. 6 is a plan view illustrating a touch sensing unit of a display device according to an embodiment.

FIG. 6 is a plan view illustrating a touch sensing unit of a display device according to one embodiment of the present disclosure.

Referring to FIG. 6, the touch sensing unit TSU may include a touch sensor area TSA for sensing a user's touch, and a touch peripheral area TPA disposed near the touch sensor area TSA. The touch sensor area TSA may overlap the display area DA of the display unit DU, and the touch peripheral area TPA may overlap the non-display area NDA of the display unit DU.

The touch sensor area TSA may include a plurality of touch electrodes SEN and a plurality of dummy electrodes DE. The plurality of touch electrodes SEN may form mutual capacitance or magnetic capacitance to sense an object or a touch of a person. The plurality of touch electrodes SEN may include a plurality of driving electrodes TE and a plurality of sensing electrodes RE.

The plurality of driving electrodes TE may be disposed in the X-axis direction and the Y-axis direction and may be spaced apart from each other in the X-axis direction and the Y-axis direction. The driving electrodes TE adjacent to each other in the Y-axis direction may be electrically connected to each other through a plurality of connection electrodes CE.

The plurality of driving electrodes TE may be connected to a first touch pad TP1 through a driving line TL. The driving line TL may include a lower driving line TLa and an upper driving line TLb. For example, some driving electrodes TE disposed on a lower side of the touch sensor area TSA may be connected to the first touch pad TP1 through the lower driving line T1*a*, and other driving electrodes TE disposed on an upper side of the touch sensor area TSA may be connected to the first touch pad TP1 through the upper driving line TLb. The lower driving line T1*a* may extend from a lower side of the touch peripheral area TPA to the first touch pad TP1. The upper driving line TLb may extend to the first touch pad TP1 via upper, left and lower sides of the touch peripheral area TPA. The first touch pad TP1 may be connected to the touch driver 400 through the circuit board 300, as shown in FIG. 3.

The connection electrodes CE may be bent at least once. For example, the connection electrodes CE may have a clamp shape ("<" or ">"), but its planar shape is not limited thereto. The driving electrodes TE adjacent to each other in the Y-axis direction may be connected to each other by the plurality of connection electrodes CE, and in the event one of the connection electrodes CE becomes disconnected, the driving electrodes TE may remain stably connected to each other through the other connection electrodes CE. The adjacent driving electrodes TE may be connected to each other by two connection electrodes CE, but the number of the connection electrodes CE is not limited thereto.

The connection electrodes CE may be disposed in a layer different from the plurality of driving electrodes TE and the plurality of sensing electrodes RE. The sensing electrodes RE adjacent to each other in the X-axis direction may be electrically connected to each other through a connection portion disposed in the same layer as the plurality of driving electrodes TE or the plurality of sensing electrodes RE. That is, the plurality of sensing electrodes RE may extend in the X-axis direction and spaced apart from each other in the Y-axis direction. The plurality of sensing electrodes RE may be disposed in the X-axis direction and the Y-axis direction, and the sensing electrodes RE adjacent to each other in the X-axis direction may be connected to each other through the connection portion.

The driving electrodes TE adjacent to each other in the Y-axis direction may be electrically connected to each other through the connection electrode CE disposed in a layer different from the plurality of driving electrodes TE or the plurality of sensing electrodes RE. The connection electrodes CE may be formed in a rear layer (or lower layer) of the layer where the driving electrodes TE and the sensing electrodes RE are formed. The connection electrodes CE are electrically connected with the driving electrodes adjacent thereto through a plurality of contact holes. Therefore, even though the connection electrodes CE overlap the plurality of sensing electrodes RE in the Z-axis direction, the plurality of driving electrodes TE may be insulated from the plurality of sensing electrodes RE. Mutual capacitance may be formed between the driving electrode RE and the sensing electrode RE.

The plurality of sensing electrodes RE may be connected to a second touch pad TP2 through a sensing line RL. For example, some sensing electrodes RE disposed on a right side of the touch sensor area TSA may be connected to the second touch pad TP2 through the sensing line RL. The sensing line RL may extend to the second touch pad TP2 via right and lower sides of the touch peripheral area TPA. The second touch pad TP2 may be connected to the touch driver 400 through the circuit board 300.

Each of the plurality of dummy electrodes DE may be surrounded by the driving electrodes TE or the sensing electrodes RE. Each of the plurality of dummy electrodes DE may be spaced apart from the driving electrode TE or the sensing electrode RE and then insulated therefrom. Therefore, the dummy electrode DE may be electrically floated.

The light shielding pattern for shielding light of a visible light wavelength band is formed in a portion of a front surface of at least one of the plurality of driving electrodes TE, the plurality of sensing electrodes RE, and the plurality of dummy electrodes DE. Alternatively, the light shielding pattern may be formed on front surfaces of the plurality of driving electrodes TE, the plurality of sensing electrodes RE and the plurality of dummy electrodes DE.

The display pad area DPA, the first touch pad area TPA1 and the second touch pad area TPA2 may be disposed at the edge of the sub-area SBA. The display pad area DPA, the first touch pad area TPA1 and the second touch pad area TPA2 may be electrically connected to the circuit board 300 by using a low resistance high reliability material such as an anisotropic conductive film or a self-assembly anisotropic conductive paste (SAP).

The first touch pad area TPA1 may be disposed on one side of the display pad area DPA and may include a plurality of first touch pads TP1. The plurality of first touch pads TP1 may electrically be connected to the touch driver 400 disposed on the circuit board 300. The plurality of first touch pads TP1 may supply the touch driving signal to the plurality of driving electrodes TE through the plurality of driving lines TL.

The second touch pad area TPA2 may be disposed on the other side of the display pad area DPA and may include a plurality of second touch pads TP2. The plurality of second touch pads TP2 may be electrically connected to the touch driver 400 disposed on the circuit board 300. The touch driver 400 may receive a touch sensing signal through the plurality of sensing lines RL connected to the plurality of second touch pads TP2, and may sense a mutual capacitance change between the driving electrode TE and the sensing electrode RE.

The touch driver 400 may supply the touch driving signal to each of the plurality of driving electrodes TE and the plurality of sensing electrodes RE and may receive the touch sensing signal from each of the plurality of driving electrodes TE and the plurality of sensing electrodes RE. The touch driver 400 may sense a change in the amount of charge applied to each of the plurality of driving electrodes TE and the plurality of sensing electrodes RE based on the touch sensing signal.

Figure 7:
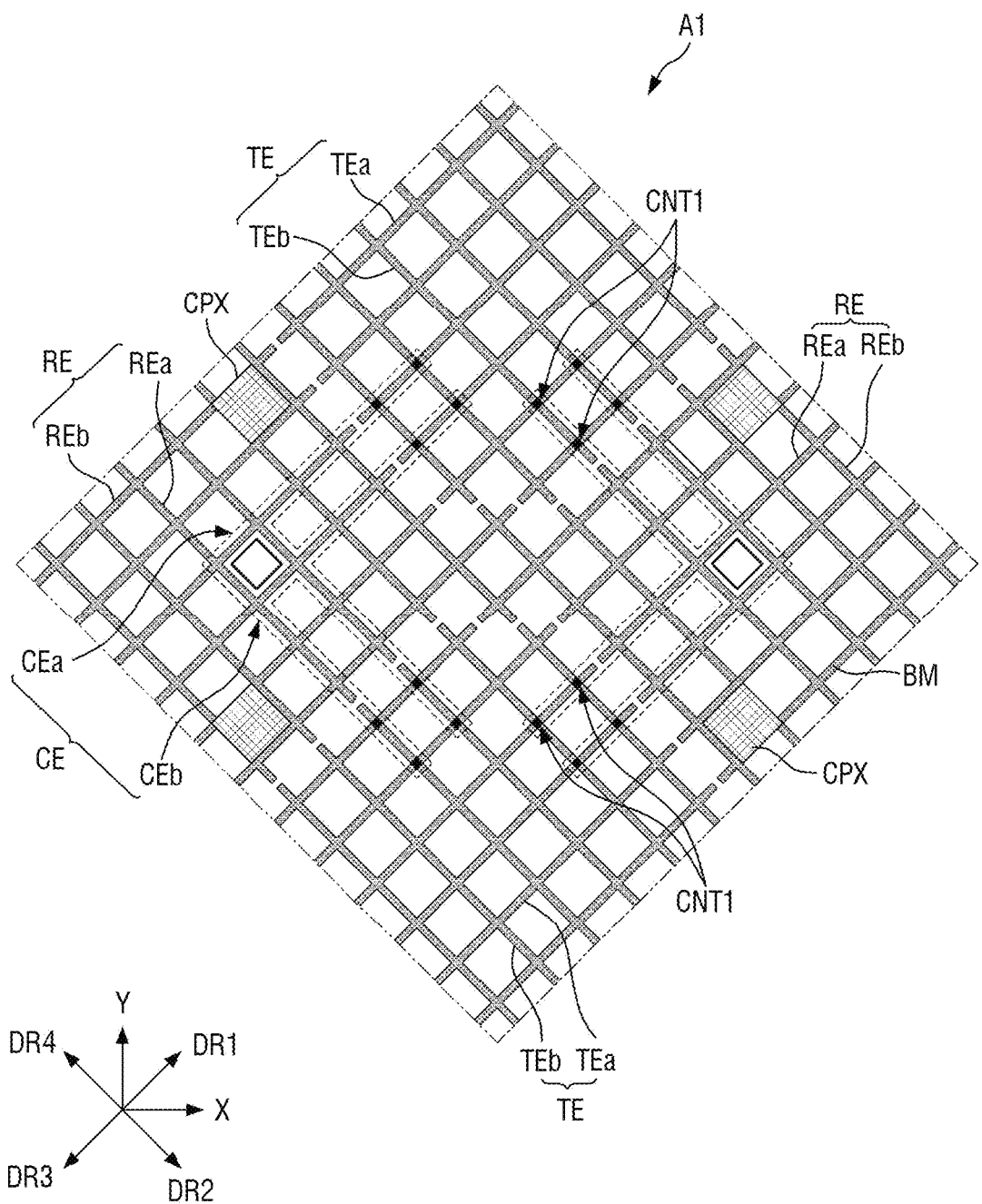
FIG. 7 is a detailed enlarged view illustrating an area A1 of FIG. 6 according to an embodiment.
Figure 8:
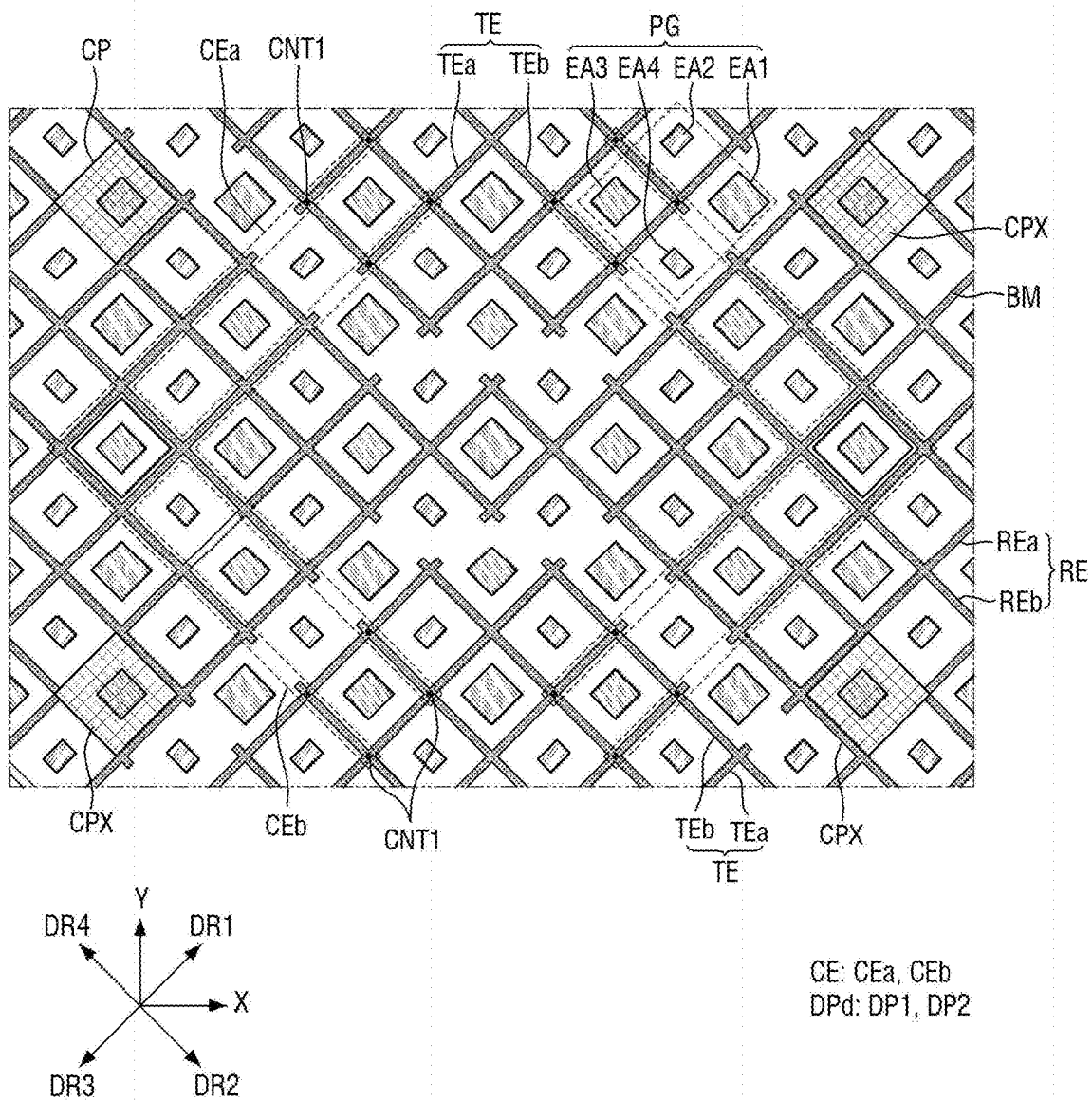
FIG. 8 is an enlarged view illustrating a structural arrangement of code patterns and light emission areas of an area A1 shown in FIG. 6 according to an embodiment.

FIG. 7 is an enlarged view illustrating an area A1, shown in FIG. 6, and FIG. 8 is an enlarged view illustrating a structural arrangement of code patterns and light emission areas of the area A1 shown in FIG. 6.

Referring to FIGS. 7 and 8, the plurality of driving electrodes TE, the plurality of sensing electrodes RE and the plurality of dummy electrodes DE may be disposed in the same layer and may be spaced apart from one another.

The plurality of driving electrodes TE may be disposed in the X-axis direction and the Y-axis direction and may be spaced apart from each other in both the X-axis direction and the Y-axis direction. The driving electrodes TE that are adjacent to each other in the Y-axis direction may be electrically connected to each other through the connection electrode CE.

The plurality of sensing electrodes RE may extend in the X-axis direction and may be spaced apart from each other in the Y-axis direction. The plurality of sensing electrodes RE may be disposed in the X-axis direction and the Y-axis direction The sensing electrodes RE adjacent to each other in the X-axis direction may be electrically connected to each other. For example, the sensing electrodes RE may be electrically connected to each other in the X-axis direction through a connection portion, wherein the connection portion may be disposed to be within a shortest distance of adjacent driving electrodes TE.

The plurality of connection electrodes CE may be disposed in a layer different from the driving electrodes TE and the sensing electrodes RE. The connection electrode CE may include a first portion Cea and a second portion Ceb. For example, the first portion Cea of the connection electrode CE may be connected to the driving electrode TE disposed on one side through a first contact hole CNT1 and extended in a third direction DR3, (see legend FIG. 7). The second portion Ceb of the connection electrode CE may extend in a second direction DR2, by being bent from the first portion Cea in an area overlapped with the sensing electrode RE, and may be connected to the driving electrode TE disposed on the other side through the first contact hole CNT1. Hereinafter, a first direction DR1 may be defined as a direction between the X-axis direction and the Y-axis direction, the second direction DR2 may be a direction opposite the first direction DR1, the third direction DR3 may be a direction opposite the first direction DR1, and a fourth direction DR4 may be a direction opposite the second direction DR2. Therefore, each of the plurality of connection electrodes CE may connect the driving electrodes TE adjacent to each other in the Y-axis direction with each other.

Each unit pixel PG may include a set of first to third subpixels or a set of first to fourth subpixels, and each of the set of first to fourth subpixels may include first to fourth light emission areas EA1 to EA4. For example, a first color filter that emits light of a first color (e.g., red light) may be formed in the first light emission area EA1 of the first subpixel to emit the light of the first color (e.g., red light). A second color filter that emits light of a second color (e.g., green light) may be formed in the second light emission area EA2 of the second subpixel to emit the light of the second color (e.g., green light). A third color filter that emits light of a third color (e.g., blue light) may be formed in the third light emission area EA3 of the third subpixel to emit the light of the third color (e.g., blue light). A color filter that emits light of a fourth color or any one of the lights of the first to third colors may be formed in the fourth light emission area EA4 of the fourth subpixel to emit the light of the fourth color or any one of the light of the first to third colors. For example, the light of the fourth color may be a white light, but is not limited thereto.

Each pixel PG may represent a white gray scale through the first to third light emission areas EA1 to EA3 or the first to fourth light emission areas EA1 to EA4. In addition, various colors of gray scales may be represented by combinations of the light emitted from the first to third light emission areas EA1 to EA3 or the first to fourth light emission areas EA1 to EA4.

In accordance with the structural arrangement of the first to third subpixels or the first to fourth subpixels, the plurality of driving electrodes TE, the plurality of sensing electrodes RE and the plurality of dummy electrodes DE may be formed in a planar mesh structure or a planar netted structure. That is, the plurality of driving electrodes TE, the plurality of sensing electrodes RE and the plurality of dummy electrodes DE may be formed and disposed in a planar mesh structure in accordance with a horizontal or vertical stripe structural arrangement or a Pentile™ matrix structural arrangement of the first to third subpixels or the first to fourth subpixels.

The plurality of driving electrodes TE, the plurality of sensing electrodes RE and the plurality of dummy electrodes DE may surround the periphery of the first to third light emission areas EA1 to EA3 or the first to fourth light emission areas EA1 to EA4, which constitute the unit pixel PG on a plane, and portions between them. Therefore, the plurality of driving electrodes TE, the plurality of sensing electrodes RE and the plurality of dummy electrodes DE may not overlap the first to fourth light emission areas EA1 to EA4. The plurality of connection electrodes CE may not overlap the first to fourth light emission areas EA1 to EA4. Therefore, the display device 10 may prevent luminance of light emitted from the first to fourth light emission areas EA1 to EA4 from being reduced by the touch sensing unit TSU.

Each of the plurality of driving electrodes TE may be formed to include a first portion Tea extended in the first direction DR1 and a second portion Teb extended in the second direction DR2 and may not overlap the first to fourth light emission areas EA1 to EA4. Similarly, each of the plurality of sensing electrodes RE may be formed to include a first portion Rea extended in the first direction DR1 and a second portion Reb extended in the second direction DR2 and may not overlap the first to fourth light emission areas EA1 to EA4. The plurality of dummy electrodes DE are also formed so as not to overlap the first to fourth light emission areas EA1 to EA4.

A light shielding pattern BM is formed on the front surfaces of the plurality of dummy electrodes DE, the plurality of driving electrodes TE and the plurality of sensing electrodes RE. Alternatively, a plurality of light shielding patterns BM may be formed in a pattern type only on a portion of the front surface of at least one of the plurality of driving electrodes TE, the plurality of sensing electrodes RE and the plurality of dummy electrodes DE. When the light shielding patterns BM are formed of a plurality of pattern types, the light shielding patterns BM may be formed in a closed loop shape such as a rectangle, square, circle, or rhombus. Alternatively, the light shielding patterns BM may be formed in an open loop shape that partially surrounds at least one light emission area. In addition, the light shielding patterns BM may be formed in a planar straight line or curved shape having a predetermined length. On the other hand, when the light shielding patterns BM surround portions between the plurality of light emission areas and the periphery of the plurality of light emission areas rather than one light emission area, the light shielding patterns BM may be formed in a planar mesh structure and a planar netted structure.

The light shielding patterns BM have a light shielding function formed within a predetermined thickness or height so as not to be recognized as code patterns CPX in the touch input device 20. That is, the light shielding patterns BM are formed within a predetermined thickness so as not to be recognized as code patterns CPX in the touch input device 20 while lowering reflectance for the plurality of driving electrodes TE, the plurality of sensing electrodes RE, and the plurality of dummy electrodes DE. To this end, the thickness or height of the light shielding patterns BM may be preset and formed differently depending on the use environment such as the external brightness of the display device 10 and an infrared intensity and a wavelength band of the touch input device 20. In particular, the light shielding patterns BM include an organic pigment capable of transmitting light of an infrared wavelength band while shielding light of a visible light wavelength band so as not to be recognized as code patterns CPX in the touch input device 20. The organic pigment may be included at a predetermined ratio in accordance with an infrared light emitting wavelength band of the touch input device 20 to absorb the infrared light of the touch input device 20.

The first to fourth light emission areas EA1 to EA4 of the first to fourth subpixels are defined by the plurality of driving electrodes TE, the plurality of sensing electrodes RE, and the plurality of dummy electrodes DE, which are respectively formed so as not to overlap the first to fourth light emission areas EA1 to EA4. Therefore, color filters emitting light of the first to fourth colors are alternately and sequentially disposed in the first to fourth light emission areas EA1 to EA4 of the first to fourth subpixels. For example, a color filter of a first color may be disposed in the first light emission area EA1, and a color filter of a second color may be disposed in the second light emission area EA2. A color filter of a third color may be disposed in the third light emission area EA3, and a color filter of any one of the first to third colors may be disposed in the fourth light emission area EA4.

The color filters of at least one color, which are disposed at predetermined intervals, among the color filters of the first to third colors or the first to fourth colors alternately and sequentially disposed in the first to fourth light emission areas EA1 to EA4 of each unit pixel PG disposed in a matrix form, may be formed and used as code patterns CPX.

For example, the blue color filters corresponding to the third color filter from among the second set of color filters, which are alternately and sequentially disposed at a predetermined interval of about 300 μm, among the color filters of the first to fourth colors (e.g., red, green, blue and green) alternately and sequentially disposed, may be formed and used as code patterns CPX. That is, the respective color filters disposed at a predetermined interval of about 300 μm among the color filters of the second set of color filters, where the blue color is the third color, may be formed and used as code patterns CPX.

Figure 9:
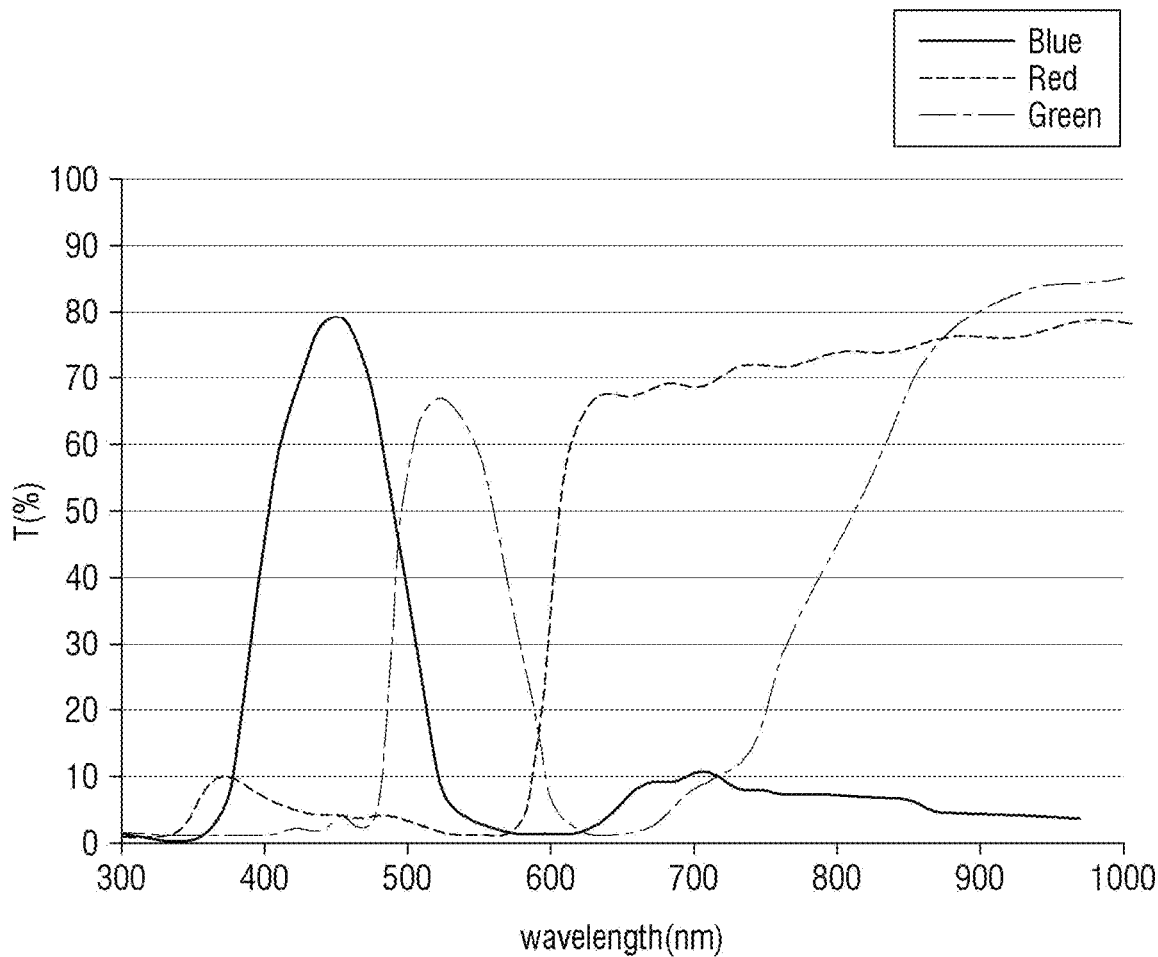
FIG. 9 is a graph illustrating a wavelength band to a color temperature of red, green and blue light emitted from each of red, green and blue light emission areas according to an embodiment.

FIG. 9 is a graph illustrating a wavelength band vs. color temperature of red, green and blue light emitted from each of the red, green and blue light emission areas.

Referring to FIG. 9, it is noted that among the red light, the blue light and the green light, the blue light is emitted at the lowest wavelength band and the green light is emitted at the highest wavelength band. Therefore, a blue color filter may be used as a code pattern CPX by an infrared absorption function such that the blue color filter emitting blue light at the lowest wavelength band includes a pigment absorbing infrared light of an infrared wavelength band. For example, when an infrared absorbing pigment that absorbs infrared light of about 850 nm to 950 nm is included in the blue color filter, the blue color filter may transmit light of the other wavelength bands while absorbing the light of the infrared wavelength.

As described above, each color filter that is formed and used as a code pattern CPX is formed to uniquely include an infrared absorbing pigment, thereby differentiating those color filters from the other color filters that are not used as code patterns CPX. In this case, the infrared absorbing pigment may be included at a predetermined ratio.

In addition, each of the color filters used as the code patterns CPX may be formed to have a shape and a planar area, which are different from those of the other color filters that are not used as the code patterns CPX. To this end, each of the color filters used as the code patterns CPX may be formed in a predetermined positional code shape. Accordingly, each of the color filters used as the code patterns CPX is sensed as a code pattern CPX in the touch input device 20 in accordance with how infrared rays are absorbed in accordance with the arrangement, shape, area, and size of the color filter. The color filters of the other color filters that are not used as the code patterns CPX may be formed of a material that transmits infrared rays without including an infrared absorbing pigment, and thus may not be sensed as code patterns CPX in the touch input device 20.

Figure 10:
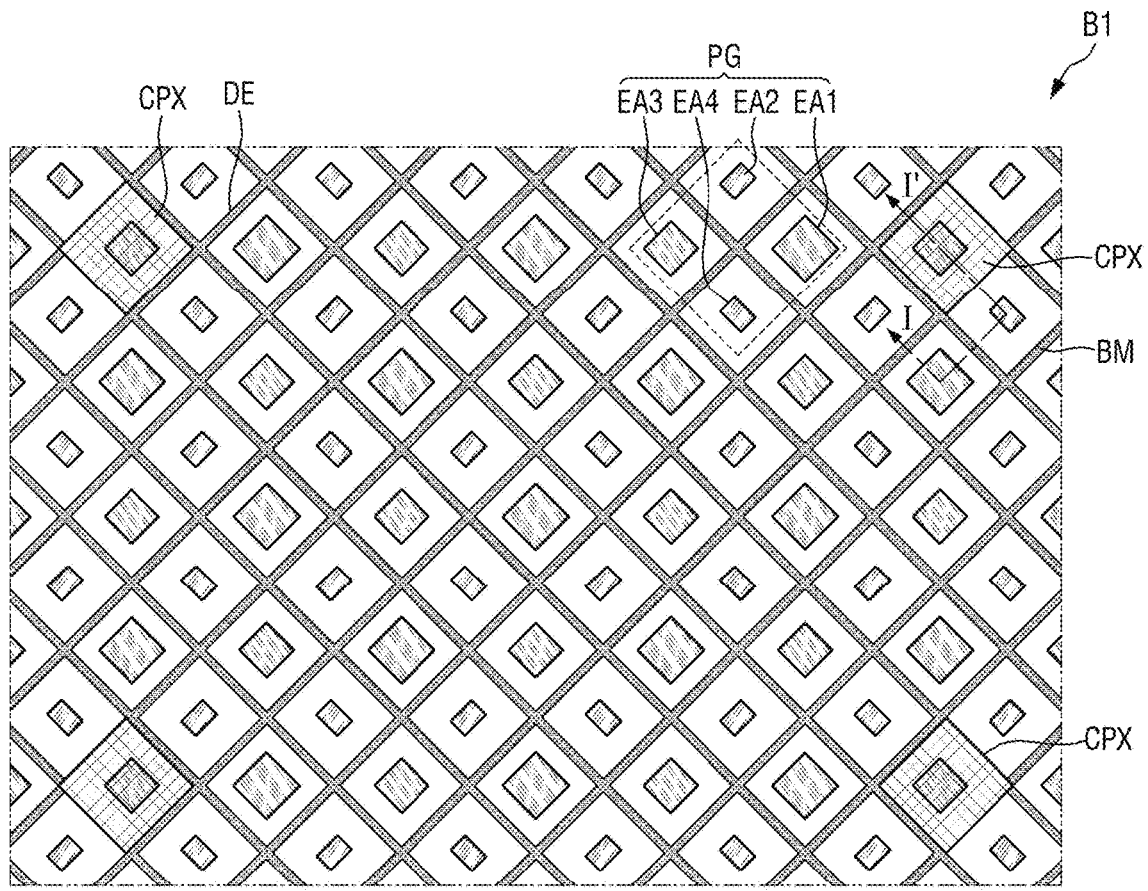
FIG. 10 is an enlarged view illustrating a structural arrangement of code patterns and light emission areas of an area B1 shown in FIG. 6 according to an embodiment.
Figure 10:
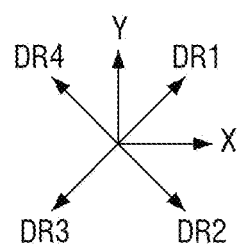

FIG. 10 is an enlarged view illustrating an arrangement structure of code patterns and light emission areas of an area B1 shown in FIG. 6.

Referring to FIG. 10, each of the color filters formed and used as the code patterns CPX may be formed to overlap a portion of a touch electrode SEN or a dummy electrode DE. Further, the color filters are disposed to be adjacent a touch electrode SEN or a dummy electrodes DE, thereby forming a position code.

Each of the color filters formed and used as the code patterns CPX may be formed to overlap a portion of the front surface of a touch electrode SEN or a dummy electrode DE. The color filters are disposed to be adjacent to at least one of four directions, i.e., first to fourth diagonal directions DR1 to DR4 As shown in FIG. 10, when each of the subpixels is disposed in a Pentile™ matrix structure, each of the color filters formed and used as the code patterns CPX may partially overlap the touch electrode SEN or the dummy electrode DE, and are disposed to be adjacent to at least one of the four diagonal directions, i.e., first to fourth directions DR1 to DR4.

For example, each of the color filters formed and used as the code patterns CPX may be formed to overlap the front surface of the dummy electrode DE disposed to be adjacent to the dummy electrodes in the first and second diagonal directions DR1 and DR2. The other color filters, not formed and used as code patterns may be formed to overlap the front surface of the dummy electrode DE, disposed to be adjacent to the third and fourth diagonal directions. Alternatively, each of the color filters formed and used as the code patterns CPX may be formed to overlap a portion of the front surface of the touch electrode SEN or the dummy electrode DE, which is disposed to be adjacent to at least one of left, right, upper and lower directions (x, y, z). When each of the subpixels is disposed in a vertical or horizontal stripe structure, each of the color filters formed and used as the code patterns CPX may partially overlap the touch electrode SEN or the dummy electrode DE, which is disposed to be adjacent to at least one of the left, right, upper, and lower directions (x, y, z).

Figure 11:
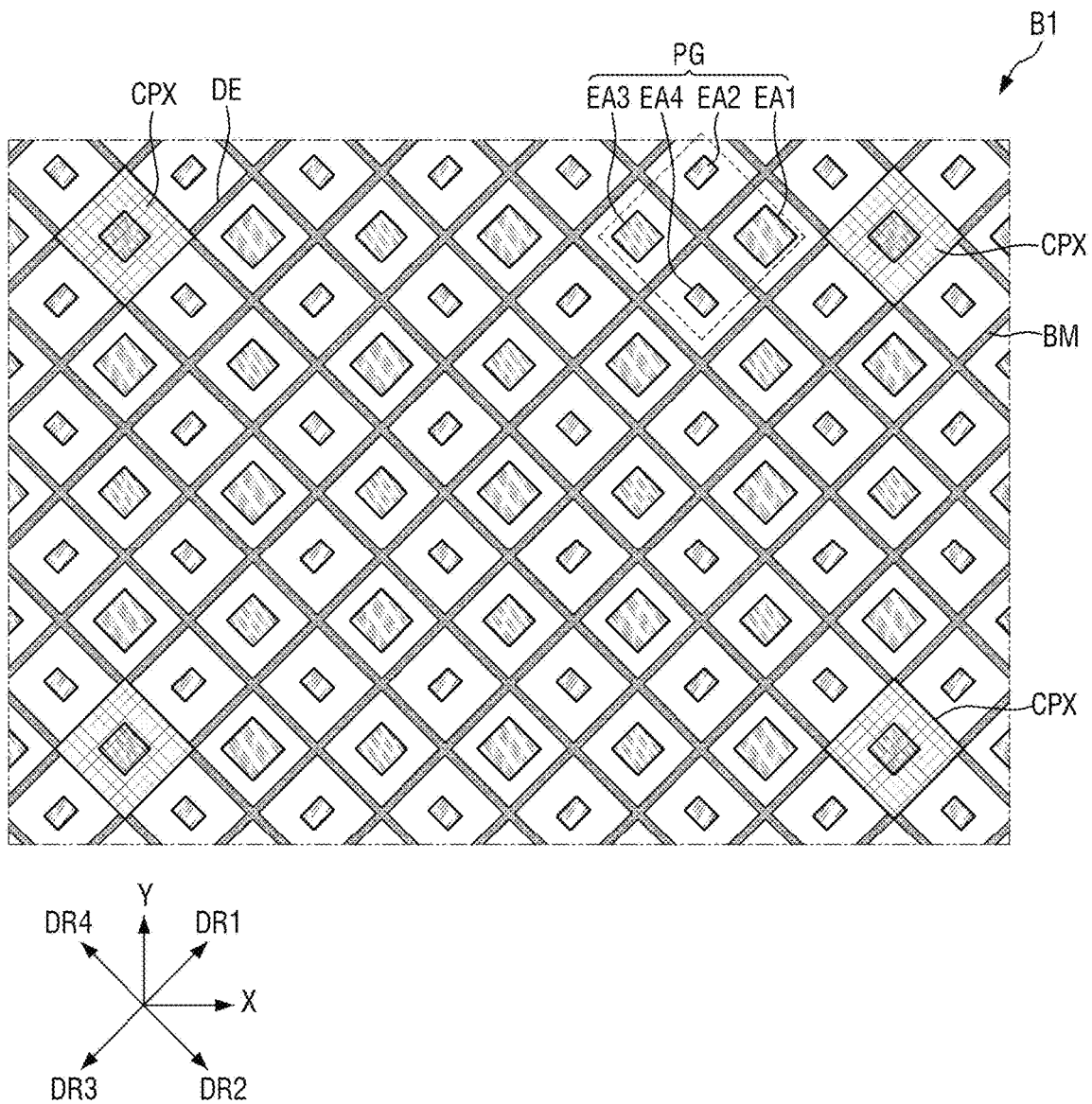
FIG. 11 is an enlarged view illustrating another arrangement shape of code patterns and light emission areas of an area B1 shown in FIG. 6 according to an embodiment.

FIG. 11 is an enlarged view illustrating another arrangement shape of code patterns and light emission areas of an area B1 shown in FIG. 6.

Referring to FIG. 11, each of the color filters formed and used as code patterns CPX may be formed to overlap a front surface of a touch electrode SEN or a dummy electrode DE, which is disposed to be adjacent thereto, thereby forming a position code.

In detail, each of the color filters formed and used as the code patterns CPX may be formed to overlap a portion of the front surface of the touch electrode SEN or the dummy electrode DE, which is disposed to be adjacent to the first to fourth directions DR1 to DR4, which are diagonal directions. Alternatively, each of the color filters formed and used as the code patterns CPX may be formed to overlap a portion of the front surface of the touch electrode SEN or the dummy electrode DE, which is disposed to be adjacent to the left, right, upper and lower directions (x and y).

Figure 12:
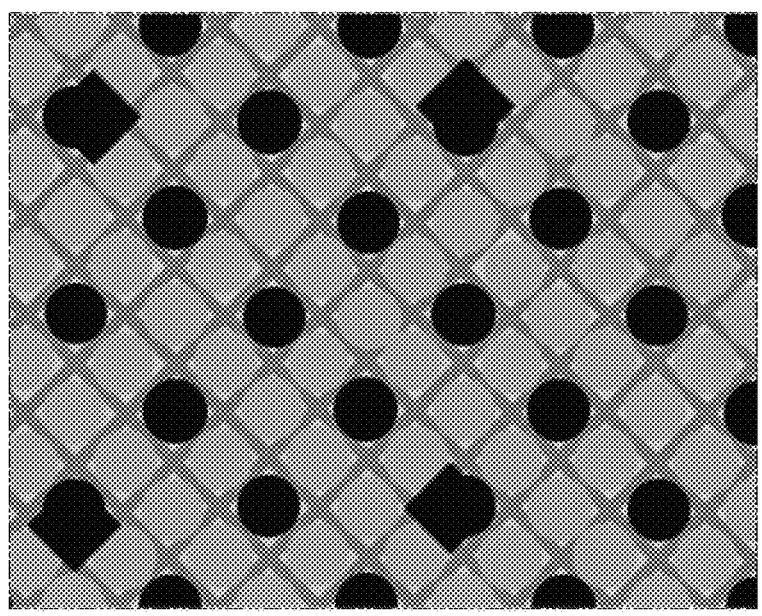
FIG. 12 is a view illustrating a code pattern image detected through a touch input device of FIG. 2 according to an embodiment.

FIG. 12 is a view illustrating a code pattern image detected through a touch input device of FIG. 2.

Referring to FIG. 12, each of the color filters formed and used as code patterns CPX includes an infrared absorbing pigment and is formed to overlap a portion of a front surface of a touch electrode SEN or a dummy electrode DE, which is disposed to be adjacent thereto. Therefore, each of the color filters formed and used as code patterns CPX may be formed in at least one of a circular, semi-circular, rhombus, rectangular, or square shape, or may be formed in an irregular shape such as a polygon.

When the code patterns CTX are detected through the touch input device 20, the code patterns CPX absorbing infrared light may be detected in at least one of a circular, semicircular, rhombus, rectangular, or square shape, which is a predetermined code shape. Alternatively, the code patterns CPX may be detected in an irregular shape such as a polygon. The other color filters are not detected as the code patterns CPX by partially transmitting or reflecting infrared light.

Figure 13:
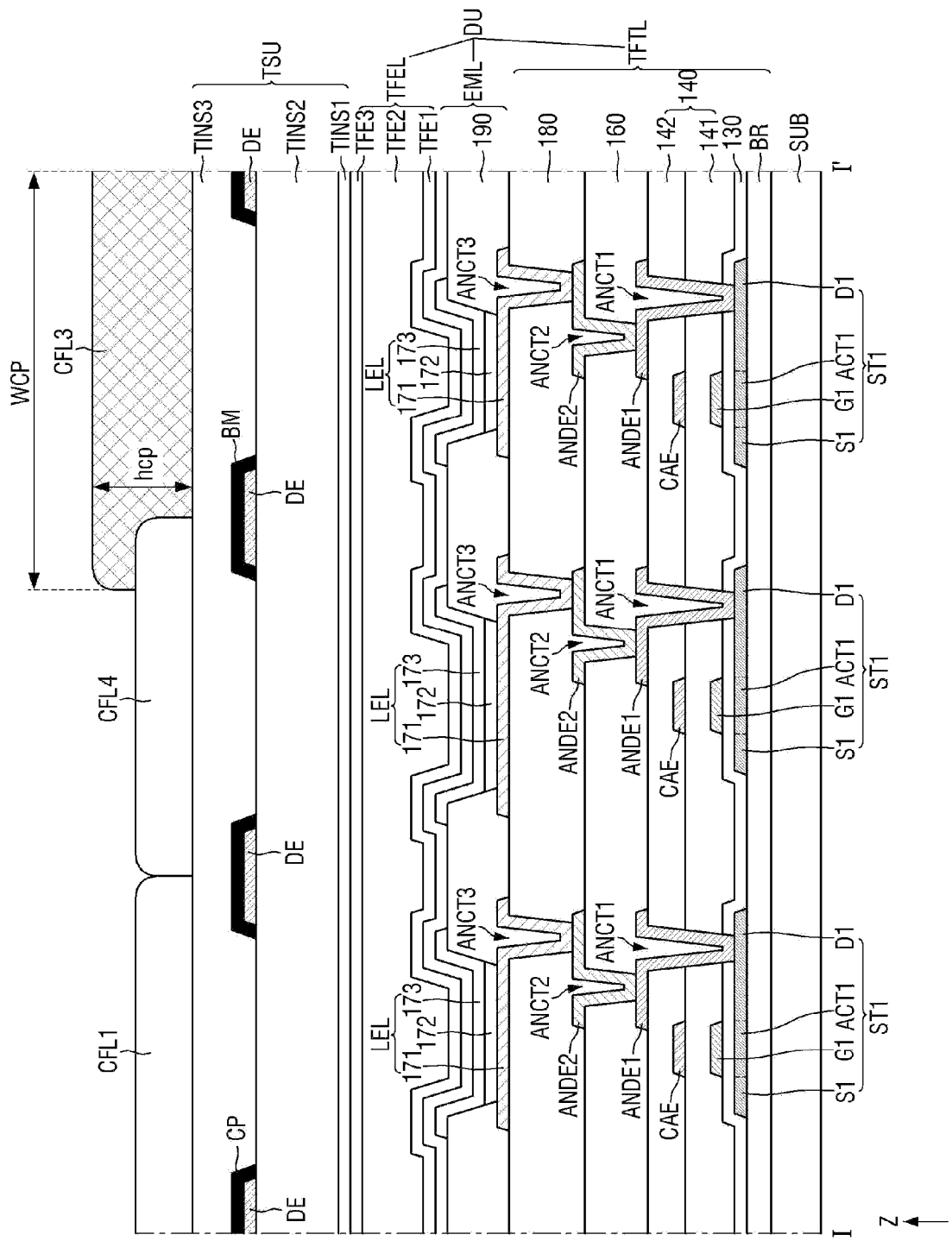
FIG. 13 is a detailed cross-sectional view taken along line I-I' of FIG. 10 according to an embodiment.
Figure 14:
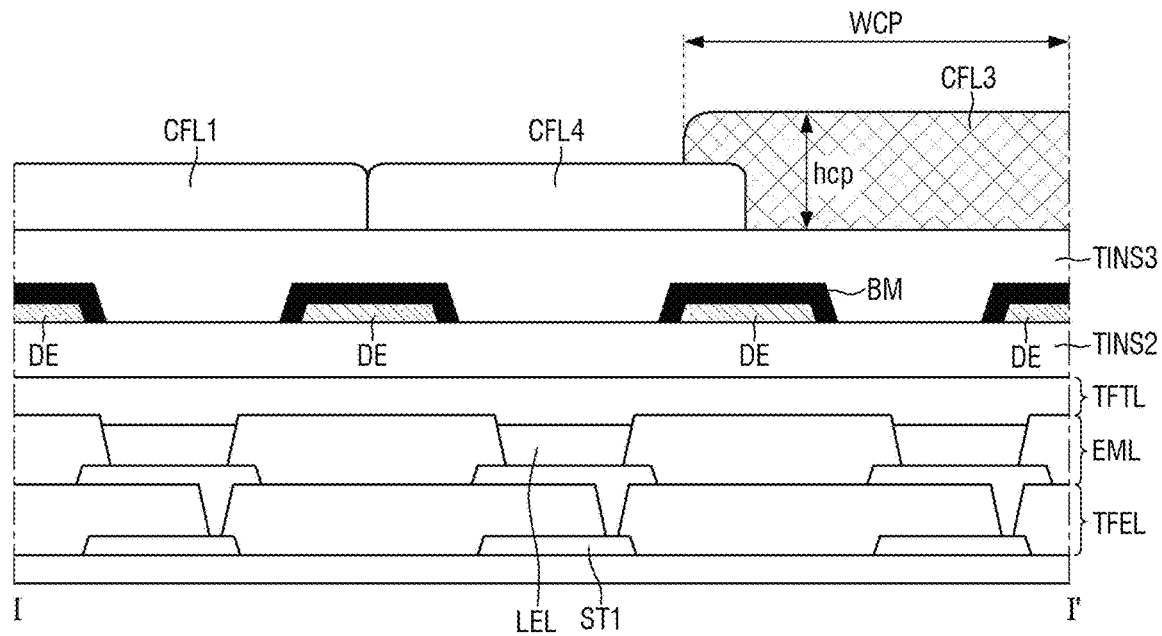
FIG. 14 is a cross-sectional view illustrating a simplified block of a cross-sectional structure of I-I' of FIG. 10 according to an embodiment.

FIG. 13 is a detailed cross-sectional view taken along line I-I' of FIG. 10 according to one embodiment of the present disclosure. FIG. 14 is a cross-sectional view illustrating a simplified block of a cross-sectional structure of I-I' of FIG. 13.

Referring to FIGS. 13 and 14, a barrier layer BR may be disposed on a substrate SUB. The substrate SUB may be formed of an insulating material such as a polymer resin. For example, the substrate SUB may be formed of polyimide. The substrate SUB may be a flexible substrate capable of being subjected to bending, folding, rolling, or the like.

The barrier layer BR is a layer for protecting the transistors of the thin film transistor layer TFTL and the light emitting layer 172 of the light emitting element layer EML from moisture permeated through the substrate SUB vulnerable to moisture permeation. The barrier layer BR may be formed of a plurality of inorganic layers that are alternately stacked. For example, the barrier layer BR may be formed of a multi-layer in which one or more inorganic layers of a silicon nitride layer, a silicon oxynitride layer, a silicon oxide layer, a titanium oxide layer, and an aluminum oxide layer are alternately stacked.

Thin film transistors ST1 may be disposed on the barrier layer BR. Each thin film transistor ST1 includes an active layer ACT1, a gate electrode G1, a source electrode S1, and a drain electrode D1.

The active layer ACT1, the source electrode S1, and the drain electrode D1 of the thin film transistors ST1 may be disposed on the barrier layer BR. The active layer ACT1 of the thin film transistor ST1 includes polycrystalline silicon, monocrystalline silicon, low temperature polycrystalline silicon, amorphous silicon, or oxide semiconductor. The active layer ACT1, which overlaps the gate electrode G1 in the third direction (Z-axis direction) that is the thickness direction of the substrate SUB, may be defined as a channel area. The source electrode S1 and the drain electrode D1 do not overlap the gate electrode G1 in the third direction (Z-axis direction), and may be doped with ions or impurities in the silicon semiconductor or the oxide semiconductor to have conductivity.

A gate insulating layer 130 may be disposed on the active layer ACT1, the source electrode S1, and the drain electrode D1 of the thin film transistor ST1. The gate insulating layer 130 may be formed of an inorganic layer, for example, a silicon nitride layer, a silicon oxynitride layer, a silicon oxide layer, a titanium oxide layer, or an aluminum oxide layer.

The gate electrode G1 of the thin film transistor ST1 may be disposed on the gate insulating layer 130. The gate electrode G1 may overlap the active layer ACT1 in the third direction (Z-axis direction). The gate electrode G1 may be formed of a single layer or multiple layers made of any one of molybdenum (Mo), aluminum (Al), chromium (Cr), gold (Au), titanium (Ti), nickel (Ni), neodymium (Nd), and copper (Cu), or their alloy.

A first interlayer insulating layer 141 may be disposed on the gate electrode G1 of the thin film transistor ST1. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may be formed of a plurality of inorganic layers.

A capacitor electrode CAE may be disposed on the first interlayer insulating layer 141. The capacitor electrode CAE may overlap the gate electrode G1 of the thin film transistor ST1 in the third direction (Z-axis direction). Since the first interlayer insulating layer 141 has a predetermined dielectric constant, a capacitor may be formed by the capacitor electrode CAE, the gate electrode G1, and the first interlayer insulating layer 141 disposed the capacitor electrode CAE and the gate electrode G1. The capacitor electrode CAE may be formed of a single layer or multiple layers made of any one of molybdenum (Mo), aluminum (Al), chromium (Cr), gold (Au), titanium (Ti), nickel (Ni), neodymium (Nd), and copper (Cu), or their alloy.

A second interlayer insulating layer 142 may be disposed on the capacitor electrode CAE. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may be formed of a plurality of inorganic layers.

A first anode connection electrode ANDE1 may be disposed on the second interlayer insulating layer 142. The first anode connection electrode ANDE1 may be connected to the drain electrode D1 of the thin film transistor ST1 through a first connection contact hole ANCT1 that passes through the gate insulating layer 130, the first interlayer insulating layer 141, and the second interlayer insulating layer 142. The first anode connection electrode ANDE1 may be formed of a single layer or multiple layers made of any one of molybdenum (Mo), aluminum (Al), chromium (Cr), gold (Au), titanium (Ti), nickel (Ni), neodymium (Nd) and copper (Cu), or their alloy.

A first planarization layer 160 may be disposed on the first anode connection electrode ANDE1 to planarize a step difference due to the thin film transistor ST1. The first planarization layer 160 may be formed of an organic layer such as an acrylic resin, an epoxy resin, a phenolic resin, a polyamide resin, and a polyimide resin.

A second anode connection electrode ANDE2 may be disposed on the first planarization layer 160. The second anode connection electrode ANDE2 may be connected to the first anode connection electrode ANDE1 through a second connection contact hole ANCT2 that passes through the first planarization layer 160. The second anode connection electrode ANDE2 may be formed of a single layer or multiple layers made of any one of molybdenum (Mo), aluminum (Al), chromium (Cr), gold (Au), titanium (Ti), nickel (Ni), neodymium (Nd) and copper (Cu), or their alloy.

A second planarization layer 180 may be disposed on the second anode connection electrode ANDE2. The second planarization layer 180 may be formed of an organic layer such as an acrylic resin, an epoxy resin, a phenolic resin, a polyamide resin, and a polyimide resin.

Light emitting elements LEL and a bank 190 may be disposed on the second planarization layer 180. Each of the light emitting elements LEL includes a pixel electrode 171, a light emitting layer 172, and a common electrode 173.

The pixel electrode 171 may be disposed on the second planarization layer 180. The pixel electrode 171 may be connected to the second anode connection electrode ANDE2 through a third connection contact hole ANCT3 that passes through the second planarization layer 180.

In a top emission structure in which light is emitted toward the common electrode 173 based on the light emitting layer 172, the pixel electrode 171 may be formed of a metal material having high reflectance, such as a stacked structure (Ti/Al/Ti) of aluminum and titanium, a stacked structure (ITO/Al/ITO) of aluminum and ITO (ITO/Al/ITO), an APC alloy and a stacked structure (ITO/APC alloy/ITO) of APC alloy and ITO. The APC alloy is an alloy of silver (Ag), palladium (Pd), and copper (Cu).

The bank 190 may be formed to partition the pixel electrode 171 on the second planarization layer 180 to define the first to third light emission areas EA1 to EA3. The bank 190 may be disposed to cover an edge of the pixel electrode 171. The bank 190 may be formed of an organic layer such as an acrylic resin, an epoxy resin, a phenolic resin, a polyamide resin, and a polyimide resin.

Each of the first to third light emission areas EA1 to EA3 refers to an area in which the pixel electrode 171, the light emitting layer 172, and the common electrode 173 are sequentially stacked such that holes from the pixel electrode 171 and electrons from the common electrode 173 are combined with each other in the light emitting layer 172 to emit light.

The light emitting layer 172 may be disposed on the pixel electrode 171 and the bank 190. The light emitting layer 172 may include an organic material to emit a predetermined color. For example, the light emitting layer 172 includes a hole transporting layer, an organic material layer, and an electron transporting layer.

The common electrode 173 may be disposed on the light emitting layer 172. The common electrode 173 may be disposed to cover the light emitting layer 172. The common electrode 173 may be a common layer commonly formed in the first light emission area EA1, the second light emission area EA2, and the third light emission area EA3. A capping layer may be formed on the common electrode 173.

In the top emission structure, the common electrode 173 may be formed of a transparent conductive material (TCO) capable of transmitting light, such as ITO and IZO, or a semi-transmissive conductive material such as magnesium (Mg), silver (Ag), or an alloy of magnesium (Mg) and silver (Ag). When the common electrode 173 is formed of a semi-transmissive conductive material, light emitting efficiency may be enhanced by a micro cavity.

The encapsulation layer TFEL may be disposed on the common electrode 173. The encapsulation layer TFEL includes at least one inorganic layer to prevent oxygen or moisture from being permeated into the light emitting element layer EML. In addition, the encapsulation layer TFEL includes at least one organic layer to protect the light emitting element layer EML from particles such as dust. For example, the encapsulation layer TFEL includes a first encapsulation inorganic layer TFE1, a second encapsulation organic layer TFE2, and a third encapsulation inorganic layer TFE3.

The first encapsulation inorganic layer TFE1 may be disposed on the common electrode 173, the encapsulation organic layer TFE2 may be disposed on the first encapsulation inorganic layer TFE1, and the second encapsulation inorganic layer TFE3 may be disposed on the encapsulation organic layer TFE2. The first encapsulation inorganic layer TFE1 and second encapsulation inorganic layer TFE3 may be formed of a multi-layer in which one or more inorganic layers of a silicon nitride layer, a silicon oxynitride layer, a silicon oxide layer, a titanium oxide layer, and an aluminum oxide layer are alternately stacked. The encapsulation organic layer TFE2 may be an organic layer such as an acrylic resin, an epoxy resin, a phenolic resin, a polyamide resin, and a polyimide resin.

A touch sensing unit TSU may be disposed on the encapsulation layer TFEL. The touch sensing unit TSU includes a first touch insulating layer TINS1, a connection electrode CE, a second touch insulating layer TINS2, a driving electrode TE, a sensing electrode RE, and a third touch insulating layer TINS3.

The first touch insulating layer TINS1 may be formed of an inorganic layer, for example, a silicon nitride layer, a silicon oxynitride layer, a silicon oxide layer, a titanium oxide layer, or an aluminum oxide layer.

The connection electrode CE may be disposed on the first touch insulating layer TINS1. The connection electrode CE may be formed of a single layer or multiple layers made of any one of molybdenum (Mo), aluminum (Al), chromium (Cr), gold (Au), titanium (Ti), nickel (Ni), neodymium (Nd), and copper (Cu), or their alloy.

The second touch insulating layer TINS2 is disposed on the first touch insulating layer TINS1 that includes the connection electrodes CE. The second touch insulating layer TINS2 may be formed of an inorganic layer, for example, a silicon nitride layer, a silicon oxynitride layer, a silicon oxide layer, a titanium oxide layer, or an aluminum oxide layer. Alternatively, the second touch insulating layer TINS2 may be formed of an organic layer such as an acrylic resin, an epoxy resin, a phenolic resin, a polyamide resin, and a polyimide resin.

The driving electrodes TE and the sensing electrode RE may be disposed on the second touch insulating layer TINS2. In addition, the dummy electrodes DE, the first touch driving lines TL1, the second touch driving lines TL2 and the touch sensing lines RL, which are shown in FIG. 4, as well as the driving electrodes TE and the sensing electrodes RE may be disposed on the second touch insulating layer TINS2.

The driving electrodes TE, the sensing electrodes RE, and the dummy electrodes DE are formed of a conductive metal electrode, and the conductive metal electrode is formed of any one or alloy of molybdenum (Mo), aluminum (Al), chromium (Cr), gold (Au), titanium (Ti), nickel (Ni), neodymium (Nd) and copper (Cu), or their alloy. The driving electrodes TE, the sensing electrodes RE and the dummy electrodes DE are formed in a mesh structure or a netted structure so as not to overlap the light emission areas EA1 to EA4. Each of the driving electrodes TE and the sensing electrodes RE may partially overlap the connection electrode CE in the third direction (Z-axis direction). The driving electrode TE may be connected to the connection electrode CE through a touch contact hole TCNT1 that passes through the second touch insulating layer TINS2.

The light shielding member, which includes an organic pigment capable of shielding light of a visible light wavelength band and transmitting light of an infrared wavelength band at a predetermined ratio, is coated on a front surface of the second touch insulating layer TINS2 that includes the driving electrodes TE, the sensing electrodes RE and the dummy electrodes DE. In detail, the light shielding member may include at least one organic pigment of lactam black, perylene black, or aniline black, but is not limited thereto. The coated light shielding member is patterned in accordance with a shape of the driving electrodes TE, the sensing electrodes RE and the dummy electrodes DE, so that a light shielding pattern BM is formed on the front surface of the plurality of dummy electrodes DE, the plurality of driving electrodes TE and the plurality of sensing electrodes RE. At this time, the light shielding pattern BM may be formed to cover both the front surface and side of at least one of the plurality of driving electrodes TE, the plurality of sensing electrodes RE, and the plurality of dummy electrodes DE. Alternatively, the light shielding pattern BM may be formed by being separated in a pattern type in some areas of the front surface and side of at least one of the plurality of driving electrode TE, the plurality of sensing electrode RE, and the plurality of dummy electrode DE. The thickness or height of the light shielding patterns BM may be preset and formed differently depending on the use environment such as external brightness of the display device 10, infrared intensity and a wavelength band of the touch input device 20.

The third touch insulating layer TINS3 is formed on the front surface of the second touch insulating layer TINS2 in which the light shielding patterns BM are formed. The third touch insulating layer TINS3 may serve to planarize a step difference formed by the driving electrodes TE, the sensing electrodes RE, and the connection electrodes CE. To this end, the third touch insulating layer TINS3 may be formed of an inorganic layer, for example, a silicon nitride layer, a silicon oxynitride layer, a silicon oxide layer, a titanium oxide layer, or an aluminum oxide layer. Alternatively, the third touch insulating layer TINS3 may be formed of an organic layer such as an acrylic resin, an epoxy resin, a phenolic resin, a polyamide resin, or a polyimide resin.

A plurality of color filters CFL1, CFL3 and CFL4 may be formed on a front surface of the third touch insulating layer TINS3, that is, on the touch sensing unit TSU. For example, the plurality of color filters CFL1, CFL3 and CFL4 may be formed on the third touch insulating layer TINS3 in a planar shape.

The first to third color filters or the first to fourth color filters may be formed on the third touch insulating layer TINS3 to overlap the first to fourth light emission areas EA1 to EA4, respectively, but may be formed on the second touch insulating layer TINS2, which includes the driving electrodes TE and the sensing electrodes RE, to overlap the first to fourth light emission areas EA1 to EA4, respectively. The first color filter CFL1 may be disposed disposed on the first light emission area EA1 emitting light of a first color, a second color filter (not shown) may be disposed on the second light emission area EA2 emitting light of a second color, and the third color filter CFL3 may be disposed on the third light emission area EA3 emitting light of a third color. Also, the second color filter (not shown) may be disposed on the fourth light emission area EA4 emitting light of the second color.

In particular, the first to third color filters, which are not used as the code patterns CPX, among the plurality of color filters CFL1, CFL3, and CFL4 may be formed of a material that transmits infrared rays without including an infrared absorbing pigment and may not be sensed as code patterns CPX in the touch input device 20.

Alternatively, each of the color filters formed and used as the code patterns CPX may further include an infrared absorbing pigment containing at least one of Cyanin-based compound, polymethine-based compound, anthraquinone-based compound, or phthalocyanine-based compound differently from other color filters that are not used as the code patterns CPX. In this case, the infrared absorbing pigment may be included at a predetermined ratio in accordance with the infrared wavelength band of the touch input device 20.

Figure 15:
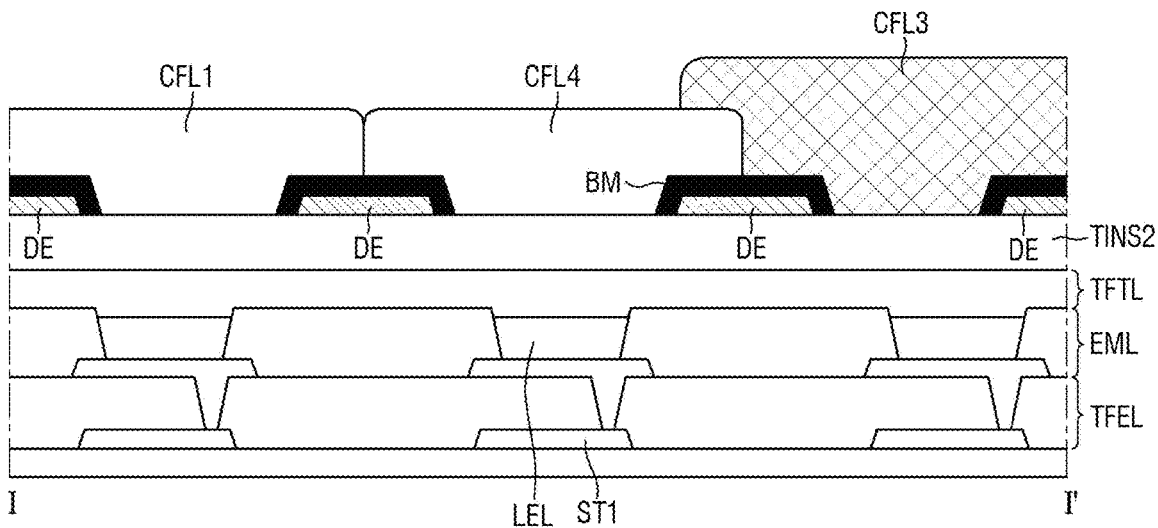
FIG. 15 is a detailed cross-sectional view taken along line I-I' of FIG. 10 according to an embodiment.

FIG. 15 is a detailed cross-sectional view taken along line I-I' of FIG. 10 according to another embodiment of the present disclosure.

Referring to FIGS. 14 and 15, each of the third color filters CFL3 used as the code patterns CPX may be formed to have a wider planar area WCP than the other color filters that are not used as the code patterns CPX. To this end, each of the third color filters CFL3 used as the code patterns CPX may be formed in a predetermined positional code shape such that each third color filter CFL3 partially overlaps adjacent touch electrode SEN or the adjacent dummy electrode DE, and such that the third color filters CFL3 are positioned adjacent to the other color filters not selected as code patterns. In particular, each of the third color filters CFL3 used as the code patterns CPX may be formed to have a higher height (hcp) or greater thickness than the other color filters disposed to be adjacent to the third color filters CFL3 so as to overlap the other adjacent color filters disposed to be adjacent thereto, and thus the third color filters CFL3 may be formed in a predetermined positional code shape.

Figure 16:
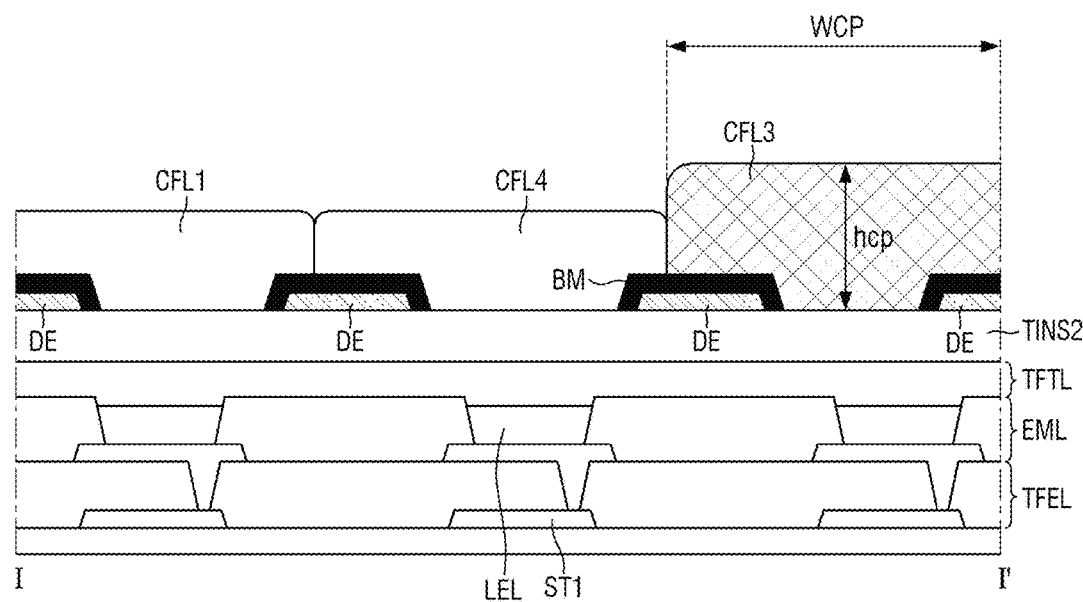
FIG. 16 is a detailed cross-sectional view taken along line I-I' of FIG. 10 according to an embodiment.

FIG. 16 s a detailed cross-sectional view taken along line I-I' of FIG. 10 according to one embodiment of the present disclosure.

Referring to FIG. 16, each of the third color filters CFL3 used as the code pattern CPX may be formed to have a wider planar area WCP than the other color filters that are not used as the code patterns CPX. To this end, each of the third color filters CFL3 used as the code patterns CPX may be formed in a predetermined code shape position by being overlapped with a portion of the front surface of the touch electrode SEN or the dummy electrode DE, which are disposed to be adjacent to the third color filters CFL3.

In particular, each of the third color filters CFL3 used as the code patterns CPX may be formed to have a higher height (hcp) or thickness) than the other color filters disposed to be adjacent thereto, and may be formed in a predetermined positional code shape by increasing an infrared absorption rate. Therefore, each of the color filters used as the code patterns CPX is sensed as a code pattern CPX in the touch input device 20 in accordance with a shape, area, and size in absorbing infrared rays.

Figure 17:
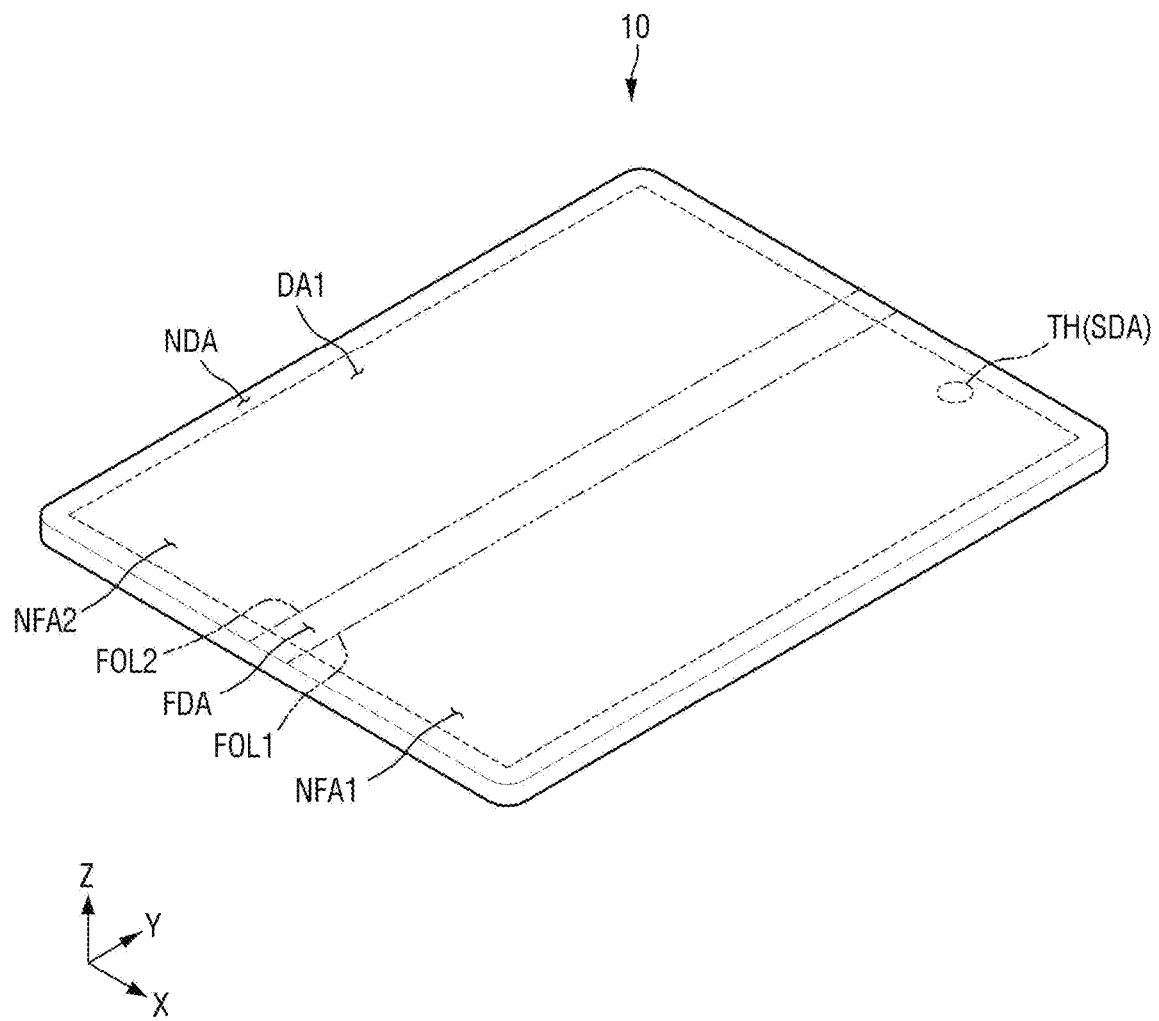
FIGS. 17 and 18 are perspective views illustrating a display device according to an embodiment.
Figure 18:
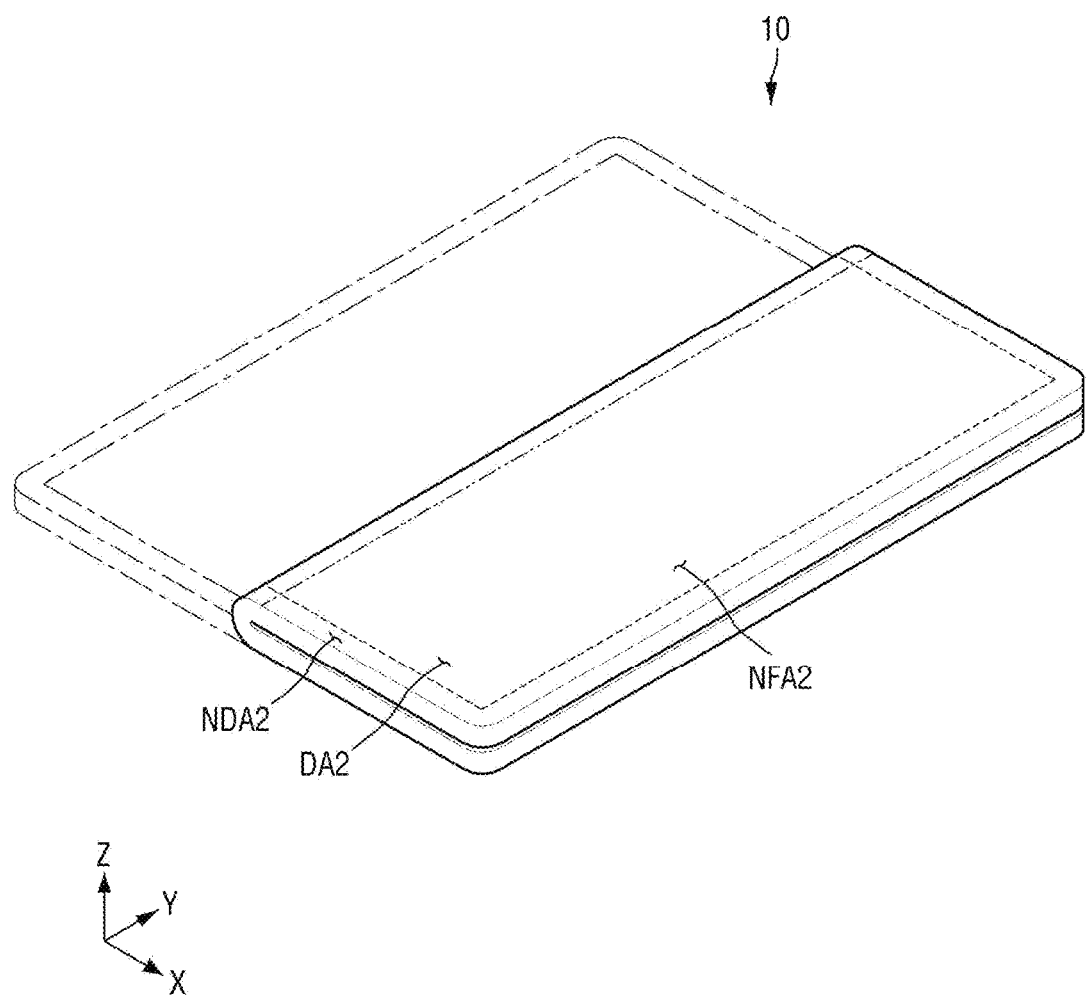

FIGS. 17 and 18 are perspective views illustrating a display device according to another embodiment of the present disclosure.

FIGS. 17 and 18 illustrate that the display device 10 is a foldable display device that is folded in the first direction (X-axis direction). The display device 10 may be maintained in both a folded state and an unfolded state. The display device 10 may be folded inwards in which case the front surface is disposed inwards. When the display device 10 is bent or folded inwards, front surfaces of the display device 10 may be disposed to face each other. Alternatively, the display device 10 may be folded outwards in which case the front surface is disposed to face outwards. When the display device 10 is bent or folded inwards, rear surfaces of the display device 10 may be disposed to face each other.

The first non-folding area NFA1 may be disposed on one side of the folding area FDA, for example, on a right side thereof. The second non-folding area NFA2 may be disposed on the other side of the folding area FDA, for example, on a left side thereof. The touch sensing unit TSU according to one embodiment of the present disclosure may be formed and disposed on the first non-folding area NFA1 and the second non-folding area NFA2, respectively.

A first folding line FOL1 and a second folding line FOL2 may extend in the second direction (Y-axis direction), and the display device 10 may be folded in the first direction (X-axis direction). As a result, since a length of the display device 10 in the first direction (X-axis direction) may be reduced to half, approximately, a user may conveniently carry the display device 10.

The extended direction of the first folding line FOL1 and the extended direction of the second folding line FOL2 are not limited to the second direction (Y-axis direction). For example, the first folding line FOL1 and the second folding line FOL2 are extended in the first direction (X-axis direction), and the display device 10 may be folded in the second direction (Y-axis direction). In this case, the length of the display device 10 in the second direction (Y-axis direction) may be reduced to approximately half. Alternatively, the first folding line FOL1 and the second folding line FOL2 may extend in a diagonal direction of the display device 10 between the first direction (X-axis direction) and the second direction (Y-axis direction). In this case, the display device 10 may be folded in a triangular shape.

When the first folding line FOL1 and the second folding line FOL2 are extended in the second direction (Y-axis direction), the length of the folding area FDA in the first direction (X-axis direction) may be shorter than the length of the folding area FDA in the second direction (Y-axis direction). In addition, the length of the first non-folding area NFA1 in the first direction (X-axis direction) may be longer than that of the folding area FDA in the first direction (X-axis direction). The length of the second non-folding area NFA2 in the first direction (X-axis direction) may be longer than the length of the folding area FDA in the first direction (X-axis direction).

The first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in a front direction in the folding area FDA, the first non-folding area NFA1 and the second non-folding area NFA2 of the display device 10.

The second display area DA2 may be disposed on the rear surface of the display device 10. The second display area DA2 may overlap the second non-folding area NFA2. Therefore, when the display device 10 is folded, an image may be displayed in a front direction in the second non-folding area NFA2 of the display device 10.

Although FIGS. 17 and 18 illustrate that a through hole TH in which a camera SDA or the like is formed, is disposed in the first non-folding area NFA1. However, the present disclosure is not limited thereto. The through hole TH or the camera SDA may be disposed in the second non-folding area NFA2 or the folding area FDA.

Figure 19:
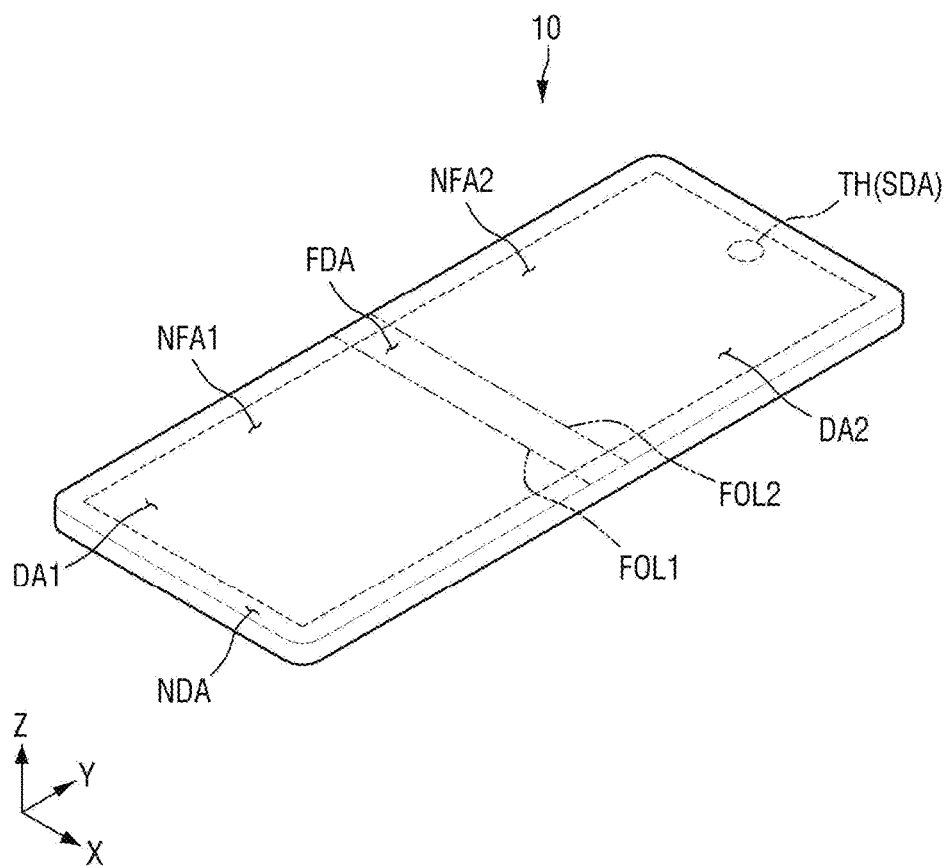
FIGS. 19 and 20 are perspective views illustrating a display device according to an embodiment.
Figure 20:
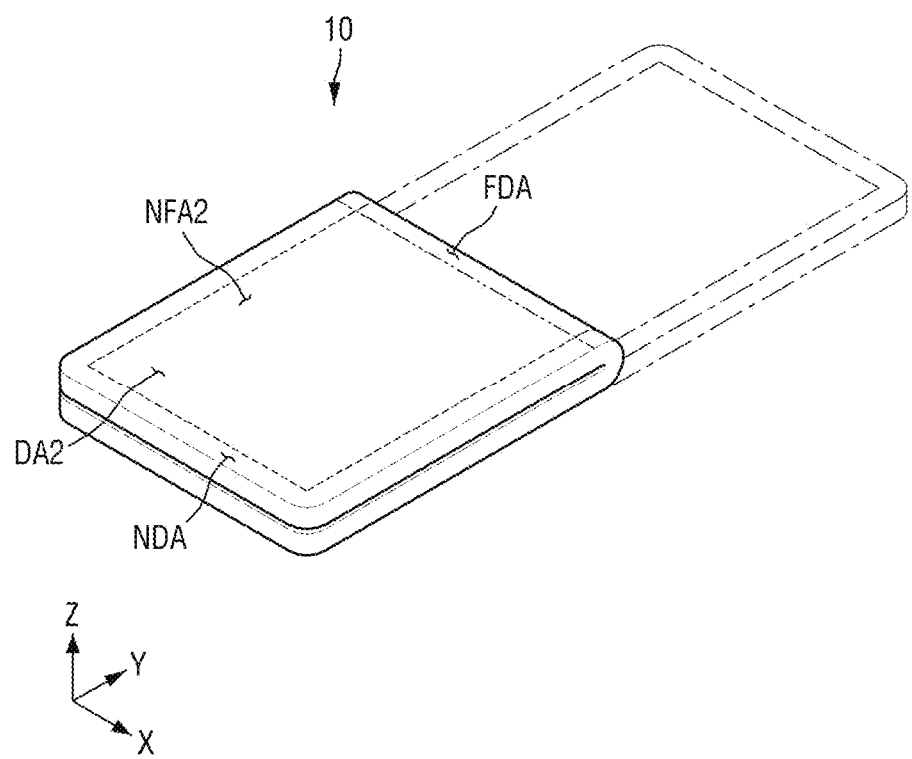

FIGS. 19 and 20 are perspective views illustrating a display device according to another embodiment of the present disclosure.

FIGS. 19 and 20 illustrate that the display device 10 is a foldable display device that is folded in the second direction (Y-axis direction). The display device 10 may be maintained in both the folded state and the unfolded state. The display device 10 may be folded in an inward folding manner in which case the front surface is disposed on the inside. When the display device 10 is bent or folded in an inward folding manner in-folding manner, the front surfaces of the display device 10 may be disposed to face each other. Alternatively, the display device 10 may be folded outwards in which the front surface is disposed outside. When the display device 10 is bent or folded outwards, the rear surfaces of the display device 10 may be disposed to face each other.

The display device 10 may include a folding area FDA, a first non-folding area NFA1, and a second non-folding area NFA2. The folding area FDA is an area where the display device 10 is folded, and the first non-folding area NFA1 and the second non-folding area NFA2 may be areas where the display device 10 is not folded. The first non-folding area NFA1 may be disposed on one side of the folding area FDA, for example, a lower side thereof. The second non-folding area NFA2 may be disposed on the other side of the folding area FDA, for example, an upper side thereof.

The touch sensing unit TSU according to one embodiment of the present disclosure may be formed and disposed on the first non-folding area NFA1 and the second non-folding area NFA2.

The folding area FDA may be an area bent at a predetermined curvature in the first folding line FOL1 and the second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

As shown in FIGS. 19 and 20, the first folding line FOL1 and the second folding line FOL2 may extend in the first direction (X-axis direction), and the display device 10 may be folded in the second direction (Y-axis direction). As a result, since the length of the display device 10 in the second direction (Y-axis direction) may be reduced to approximately half the length of the display device 10 in the first direction, the user may conveniently carry the display device 10.

The extended direction of the first and second folding lines FOL1 and FOL2 are not limited to the first direction (X-axis direction). For example, the first folding line FOL1 and the second folding line FOL2 may extend in the second direction (Y-axis direction), and the display device 10 may be folded in the first direction (X-axis direction). In this case, the length of the display device 10 in the first direction (X-axis direction) may be reduced to approximately half, Alternatively, the first folding line FOL1 and the second folding line FOL2 may extend in a diagonal direction of the display device 10 between the first direction (X-axis direction) and the second direction (Y-axis direction). In this case, the display device 10 may be folded in a triangular shape.

When the first folding line FOL1 and the second folding line FOL2 are extended in the first direction (X-axis direction) as shown in FIGS. 19 and 20, the length of the folding area FDA in the second direction (Y-axis direction) may be shorter than the length of the folding area FDA in the first direction (X-axis direction). In addition, the length of the first non-folding area NFA1 in the second direction (Y-axis direction) may be longer than the length of the folding area FDA in the second direction (Y-axis direction). The length of the second non-folding area NFA2 in the second direction (Y-axis direction) may be longer than the length of the folding area FDA in the second direction (Y-axis direction).

The first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in a front direction in the folding area FDA, the first non-folding area NFA1, and the second non-folding area NFA2 of the display device 10.

The second display area DA2 may be disposed on the rear surface of the display device 10. The second display area DA2 may overlap the second non-folding area NFA2. Therefore, when the display device 10 is folded, an image may be displayed in the front direction in the second non-folding area NFA2 of the display device 10.

Although FIGS. 19 and 20 illustrate that the through hole TH, in which the camera SDA or the like is disposed, is disposed in the second non-folding area NFA2, the present disclosure is not limited thereto. The through hole TH may be disposed in the first non-folding area NFA1 or the folding area FDA.

Those skilled in the art will appreciate that many variations and modifications can be made to the preferred embodiments without substantially departing from the principles of the present disclosure. Therefore, the disclosed preferred embodiments are used in a generic and descriptive sense without limitation.

What is claimed is:

1. A display device comprising:
a display unit including a plurality of light emission areas;
a plurality of touch electrodes disposed between the plurality of light emission areas configured to sense a touch input;
at least one light shielding pattern formed by covering at least a portion of a front surface of at least one touch electrode of the plurality of touch electrodes; and
a plurality of color filters comprising one of a first set of color filters including first to third color filters and a second set of color filters including first to fourth color filters;
wherein the plurality of color filters is alternately disposed in the plurality of light emission areas, and
wherein the color filters selected from among the first set of color filters or the second set of color filters are used as code patterns by including an infrared absorbing pigment in the selected color filters.

2. The display device of claim 1, wherein the plurality of touch electrodes includes a plurality of driving electrodes, a plurality of sensing electrodes, and a plurality of dummy electrodes, and wherein each of the plurality of driving electrodes, the plurality of sensing electrodes and the plurality of dummy electrodes are formed in a mesh structure surrounding portions between the plurality of light emission areas and a periphery of the plurality of light emission areas.

3. The display device of claim 2, wherein the at least one light shielding pattern has one of a planar closed loop shape, an open loop shape partially surrounding at least one light emission area of the plurality of light emission areas, and a straight line shape of a predetermined length.

4. The display device of claim 3, wherein the at least one light shielding pattern includes an organic pigment configured to shield light of a visible light band and transmit infrared rays, and
wherein the at least one light shielding pattern is patterned to cover the portion of a front surface and a side surface of the at least one touch electrode.

5. The display device of claim 2, wherein the at least one light shielding pattern includes at least one of an organic pigment of lactam black, an organic pigment of perylene black, or an organic pigment of aniline black.

6. The display device of claim 2, wherein the at least one light shielding pattern is formed in mesh shape surrounding portions, the light shielding pattern being disposed between the plurality of light emission areas and the periphery of the light emission areas and patterned to cover the portion of a front surface and a side surface of the at least one touch electrode.

7. The display device of claim 2, wherein third color filters selected for use as code patterns from among the first or second set of color filters, are disposed at a predetermined interval among the color filters from among the first or second set of color filters not selected for use as the code patterns.

8. The display device of claim 7, wherein the third color filters selected for use as code patterns from among the first or second set of color filters are formed in a shape and planar area different from a shape and a planar area of the color filters from among the first or second set of color filters not selected for use as the code patterns.

9. The display device of claim 7, wherein the infrared absorbing pigment is included in the color filters selected for use as the code patterns at a predetermined ratio in accordance with an infrared light emitting wavelength band of a touch input device to absorb infrared light emitted from the touch input device.

10. The display device of claim 7, wherein the third color filters selected for use as code patterns from among the first or second set of color filters overlap a portion of one of the touch electrodes or the dummy electrodes, disposed adjacent to one of the touch electrodes or the dummy electrodes to form a position code.

11. The display device of claim 7, wherein the third color filters selected for use as the code patterns from among the first or second set of color filters overlap a portion of a front surface of one of the touch electrodes or the dummy electrodes and are disposed adjacent to at least one of four diagonal directions.

12. The display device of claim 11, wherein the third color filters selected for use as the code patterns from among the first or second set of color filters are formed to overlap a front surface of one of the touch electrodes or the dummy electrodes, disposed to be adjacent to either first and second directions or third and fourth directions.

13. The display device of claim 7, wherein the third color filters selected for use as the code patterns from among the first or second set of color filters are formed to overlap a portion of one of a front surface of the touch electrodes or the dummy electrodes, and are disposed to be adjacent to at least one of a left, a right, an upper, or a lower direction.

14. The display device of claim 7, wherein the third color filters selected for use as the code patterns from among the first or second set of color filters are formed to have a planar area wider than a planar area of the color filters from among the first or second set of color filters not selected for use as the code patterns.

15. The display device of claim 7, wherein the third color filters selected for use as use as the code patterns are formed to include at least one of a cyanin-based compound, a polymethine-based compound, an anthraquinone-based compound, or a phthalocyanine-based compound.

16. The display device of claim 7, wherein the third color filters selected for use as the code patterns from among the first or second set of code patterns are formed in a predetermined positional code shape by being partially overlapped with one of the touch electrode or the dummy electrode, and wherein the third color filters are disposed adjacent to one of the touch electrode or the dummy electrode and to other color filters from among the first or second set of color filters not selected for use as code patterns.

17. The display device of claim 7, wherein the third color filters selected for use as the code patterns from among the first or second set of code patterns are formed to have a higher height or greater thickness than the color filters disposed to be adjacent thereto, not selected for use as the code patterns, such that a portion of the third color filters overlaps a color filter, other than the third color filters, disposed to be adjacent thereto.

18. The display device of claim 7, wherein the third color filters selected for use as the code patterns from among the first or second set of code patterns are formed to have a higher height or greater thickness higher than the color filters from among the first or second set of color filters not selected for use as the code patterns, wherein the third color filters are disposed adjacent to the color filters from among the first and second set of code patterns not selected for use and wherein the third color filters are formed in a predetermined positional code shape position by being overlapped with a portion of a front surface of one of the touch electrode or the dummy electrode.

19. A touch input system comprising:
a display device configured to display an image; and
a touch input device configured to receive a touch input on the display device,
wherein the display device includes:
a display unit including a plurality of light emission areas;
a plurality of touch electrodes disposed between the plurality of light emission areas configured to sense the touch input;
at least one light shielding pattern formed by covering at least a portion of a front surface of at least one touch electrode of the plurality of touch electrodes; and
a plurality of color filters comprising one of a first set of color filters including first to third color filters and a second set of color filters including first to fourth color filters wherein the plurality of color filters is alternately disposed in the plurality of light emission areas,
wherein color filters from among the first set of color filters or the second set of color filters are selected for use as a code pattern by including an infrared absorbing pigment in the selected color filters.

20. The touch input system of claim 19, wherein the touch input device includes:
a code detector configured to detect code patterns;
a code processor configured to receive shape data for the code patterns, extract a data code corresponding to a shape of the code patterns, and generate coordinate data corresponding to the data code; and
a communication module configured to transmit the coordinate data to the display device.

* * * * *